United States Patent
Oguni et al.

(10) Patent No.: US 12,242,787 B2
(45) Date of Patent: Mar. 4, 2025

(54) PARAMETER SEARCH METHOD

(71) Applicant: SEMICONDUCTOR ENERGY LABORATORY CO., LTD., Atsugi (JP)

(72) Inventors: Teppei Oguni, Kanagawa (JP); Takeshi Osada, Kanagawa (JP); Takahiro Fukutome, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/591,680

(22) Filed: Feb. 29, 2024

(65) Prior Publication Data

US 2024/0211670 A1  Jun. 27, 2024

Related U.S. Application Data

(63) Continuation of application No. 17/424,043, filed as application No. PCT/IB2020/050854 on Feb. 4, 2020, now Pat. No. 11,934,759.

(30) Foreign Application Priority Data

Feb. 15, 2019 (JP) ................. 2019-025661
Apr. 2, 2019 (JP) ................. 2019-070351

(51) Int. Cl.
  *G06F 30/367*  (2020.01)
  *G06N 3/042*   (2023.01)
  *G06N 3/08*    (2023.01)

(52) U.S. Cl.
  CPC .......... *G06F 30/367* (2020.01); *G06N 3/042* (2023.01); *G06N 3/08* (2013.01)

(58) Field of Classification Search
  USPC ........ 716/100, 101, 103, 104, 105, 107, 106
  See application file for complete search history.

(56) References Cited

U.S. PATENT DOCUMENTS 7,287,012 B2  10/2007  Corston et al.
8,527,257 B2   9/2013  Reddy et al.
(Continued)

FOREIGN PATENT DOCUMENTS

CA    3064771      12/2018
JP    2003-050835 A  2/2003
(Continued)

OTHER PUBLICATIONS

International Search Report (Application No. PCT/IB2020/050854) Dated Apr. 14, 2020.
(Continued)

*Primary Examiner* — Brian Ngo
(74) *Attorney, Agent, or Firm* — Fish & Richardson P.C.

(57) ABSTRACT

A parameter candidate for a semiconductor element is provided. A data set of measurement data is provided to a parameter extraction portion, and a model parameter is extracted. A first netlist is provided to a circuit simulator, simulation is performed using the first netlist and the model parameter, and a first output result is output. A classification model learns the model parameter and the first output result and classifies the model parameter. A second netlist and a model parameter are provided to the circuit simulator. A variable to be adjusted is supplied to a neural network, an action value function is output, and the variable is updated. The circuit simulator performs simulation using the second netlist and the model parameter. When a second output result to be output does not satisfy conditions, a weight coefficient of the neural network is updated. When the second output result satisfies the conditions, the variable is judged to be the best candidate.

8 Claims, 14 Drawing Sheets

(56) References Cited

U.S. PATENT DOCUMENTS

| | | | |
|---|---|---|---|
| 8,935,146 B2 | 1/2015 | Arimoto. et al. | |
| 10,949,595 B2 | 3/2021 | Tsutsui et al. | |
| 2009/0307638 A1* | 12/2009 | McConaghy | G06F 30/36 |
| | | | 716/100 |
| 2010/0185431 A1 | 7/2010 | Kokuda | |
| 2013/0006595 A1 | 1/2013 | Reddy et al. | |
| 2016/0253445 A1 | 9/2016 | Pataky | |
| 2016/0343452 A1 | 11/2016 | Ikeda et al. | |
| 2019/0050514 A1* | 2/2019 | Ceppi | G06F 30/33 |

FOREIGN PATENT DOCUMENTS

| | | |
|---|---|---|
| JP | 2005-038216 A | 2/2005 |
| JP | 2008-250981 A | 10/2008 |
| JP | 2013-020614 A | 1/2013 |
| WO | WO-2018/234945 | 12/2018 |
| WO | WO-2020/165688 | 8/2020 |

OTHER PUBLICATIONS

Written Opinion (Application No. PCT/IB2020/050854) Dated Apr. 14, 2020.
Wang.H et al., "Learning to Design Circuits", NIPS 2018 Workshop on Machine Learning for Systems, Dec. 8, 2018, pp. 1-7.
Wang.H et al., "Learning to Design Circuits", arXiv:1812.02734, Jan. 17, 2019, pp. 1-7, Cornell University.
Chinese Office Action (Application No. 202080010985.X) Dated Dec. 31, 2024.

* cited by examiner

FIG. 11

```
* Inverter DC Optimization
1  .PARAM w1==${param_w1}u

2  .include ${param_fname}

3  vdd 1 0 5V
4  vin 2 0 pulse(0 5 2n 0.2n 0.2n 4n 8.4n)

5  m1 3 2 1 1 pm w='w1*2' l=1u
6  m2 3 2 0 0 nm w=w1 l=1u

7  .MODEL pm PMOS
8  .MODEL nm NMOS

9  .MEASURE TRAN iavg AVG I(vdd)
10 .MEASURE TRAN tpd TRIG V(2) VAL=2.5 RISE=1 TARG V(3)
        VAL=2.5 FALL=1

11 .OPTION NOACCT
12 .TRAN 5ps 8ns
13 .END
```

FIG. 12

```
# simulator
1  spice: ngspice netlist filename
2  netlist: ./inv-tran.in output directory
3  outdir: ./outdir parameter: param_name, type, initial, min, max, ratio or delta
4  param: param_w1, float, 10, 1, 20, 0.1
5  param: param_fname, str, 'libfiles/level3-sample-01.lib',
   'libfiles/level3-sample-02.lib', 'libfiles/level3-sample-03.lib',
   'libfiles/level3-sample-04.lib', 'libfiles/level3-sample-05.lib',
   'libfiles/level3-sample-06.lib', 'libfiles/level3-sample-07.lib',
   'libfiles/level3-sample-08.lib', 'libfiles/level3-sample-09.lib',
   'libfiles/level3-sample-10.lib', 'libfiles/level3-sample-11.lib',
   'libfiles/level3-sample-12.lib', 'libfiles/level3-sample-13.lib',
   'libfiles/level3-sample-14.lib', 'libfiles/level3-sample-15.lib',
   'libfiles/level3-sample-16.lib', 'libfiles/level3-sample-17.lib',
   'libfiles/level3-sample-18.lib', 'libfiles/level3-sample-19.lib',
   'libfiles/level3-sample-20.lib' target: target_name, target_value, target_range
6  target: iavg, -2.5e-6, 0.1
7  target: tpd, 2.0e-11, 0.1 result_logging: xx
8  result_logging: 100
```

PARAMETER SEARCH METHOD

TECHNICAL FIELD

One embodiment of the present invention relates to a learning method, a classification method, a selection method, or a search method of a semiconductor parameter by utilizing a computer.

Note that one embodiment of the present invention is not limited to the above technical field. Examples of a technical field of one embodiment of the present invention disclosed in this specification and the like include parameter search for chemical synthesis, and the like.

Note that one embodiment of the present invention relates to a computer. One embodiment of the present invention relates to a parameter search method of a computerized netlist by utilizing a computer. One embodiment of the present invention relates to a parameter classification method that enables extraction of model parameters from a semiconductor element data set, learning of a group of model parameters by a classification model, and classification of the model parameters by the classification model. One embodiment of the present invention relates to a parameter selection method in which a model parameter that is suitable for required characteristics of a target netlist is selected by the parameter classification method. One embodiment of the present invention relates to a parameter search method in which search is performed using reinforcement learning so that a variable of a netlist supplied to a circuit simulator is the best candidate satisfying required characteristics of the netlist.

BACKGROUND ART

A user creates a netlist that is circuit information for circuit design. Note that required characteristics of circuit information (hereinafter referred to as a netlist) vary depending on operating environments. The user performs simulation using a circuit simulator to achieve the required characteristics of the netlist. The user searches for the best candidate for a model parameter that satisfies the required characteristics of the netlist while updating model parameters of a semiconductor element included in the netlist.

Note that in order to perform simulation using the circuit simulator, it is necessary to extract an appropriate model parameter by using measurement data of the semiconductor element and a process parameter and supply the model parameter to the circuit simulator. In order that the user can select the best candidate for the model parameter satisfying the required characteristics of the netlist, it is necessary to perform circuit simulation using the circuit simulator every time the model parameter is updated. Accordingly, in order to search for the best candidate for the model parameter, simulation results of the circuit simulator need to be judged every time the user performs simulation.

In recent years, parameter adjustment of a transistor physical model by using genetic algorithm has been known. Patent Document 1 discloses a parameter adjustment device in which genetic algorithm is used for parameter adjustment of a transistor physical model.

PRIOR ART DOCUMENT

Patent Document

[Patent Document 1] Japanese Published Patent Application No. 2005-038216

SUMMARY OF THE INVENTION

Problems to be Solved by the Invention

In the case where model parameters of a plurality of semiconductor elements included in a netlist are handled, there has been a problem in that a user needs to judge whether the model parameters satisfy required characteristics of the netlist.

For example, in the case where the netlist includes the plurality of semiconductor elements, the number of model parameters of the semiconductor elements that satisfy the required characteristics of the netlist is not limited to one and is sometimes more than one. In the case where the user judges simulation results, there is a possibility that the user extracts a parameter satisfying the required characteristics and then judges that the parameter has an optimal value. In other words, there has been a problem in that the user might overlook the existence of a different model parameter that may better satisfy the required characteristics. Therefore, there has been a problem in that judgment of the simulation results of the circuit simulator depends on user's experience.

In addition, even the same netlist sometimes has different required characteristics. For example, there are a circuit aiming at low power consumption, a circuit focusing on operating frequency, a circuit stably operating in a specified frequency band, and the like. The required characteristics of the netlist cannot be satisfied when the model parameter is fixed, which is problematic.

In view of the above problems, an object of one embodiment of the present invention is to provide a parameter search method of a computerized netlist by utilizing a computer. Alternatively, an object of one embodiment of the present invention is to provide a parameter classification method that enables extraction of model parameters from a semiconductor element data set, learning of a group of model parameters by a classification model, and classification of the model parameters by the classification model. Alternatively, an object of one embodiment of the present invention is to provide a parameter selection method in which a model parameter that is suitable for required characteristics of a target netlist is selected by the parameter classification method.

An object of one embodiment of the present invention is to provide a parameter search method in which search is performed using reinforcement learning so that a variable of a netlist supplied to a circuit simulator is the best candidate satisfying required characteristics of the netlist.

Note that the description of these objects does not preclude the existence of other objects. Note that one embodiment of the present invention does not have to achieve all these objects. Note that objects other than these will be apparent from the description of the specification, the drawings, the claims, and the like, and objects other than these can be derived from the description of the specification, the drawings, the claims, and the like.

Means for Solving the Problems

One embodiment of the present invention is a parameter search method using a classification model, a neural network, a parameter extraction portion, a circuit simulator, and a control portion. The parameter search method includes a step of providing a data set of a semiconductor element to the parameter extraction portion. The parameter search method includes a step of extracting a model parameter of the semiconductor element by the parameter extraction portion. The parameter search method includes a step of performing simulation by the circuit simulator using a first netlist and the model parameter and outputting a first output result. The parameter search method includes a step of learning the first output result by the classification model, classifying the model parameter, and outputting a first model parameter. The parameter search method includes a step of providing a second netlist and a second model parameter from the control portion to the circuit simulator. The parameter search method includes a step of supplying a first model parameter variable included in the second model parameter from the control portion to the neural network. The parameter search method includes a step of calculating a first action value function Q from the first model parameter variable by the neural network. The parameter search method includes a step of updating the first model parameter variable to a second model parameter variable by the control portion using the first action value function Q and outputting a third model parameter. The parameter search method includes a step of performing simulation by the circuit simulator using the second netlist and the third model parameter and outputting a second output result. The parameter search method includes a step of judging the second output result by the control portion using a convergence condition given to the second netlist. The parameter search method includes a step of setting a reward by the control portion when the second output result is judged not to satisfy required characteristics of the second netlist and updating a weight coefficient of the neural network using the reward. When the second output result is judged to satisfy the required characteristics of the second netlist, the first model parameter variable can be judged to be the best candidate for the second netlist.

One embodiment of the present invention is a parameter search method using a classification model, a neural network, a parameter extraction portion, a circuit simulator, and a control portion. The parameter search method includes a step of supplying measurement data of a semiconductor element and a data set including a process parameter to the parameter extraction portion. The parameter search method includes a step of extracting a model parameter by the parameter extraction portion. The parameter search method includes a step of providing a first netlist from the control portion to the circuit simulator. The parameter search method includes a step of outputting a first output result by the circuit simulator using the model parameter and the first netlist. The parameter search method includes a step of learning the model parameter and the first output result by the classification model, classifying the model parameter, and outputting a first model parameter. The parameter search method includes a step of providing a second netlist and a second model parameter from the control portion to the circuit simulator. The parameter search method includes a step of supplying a first model parameter variable included in the second model parameter from the control portion to the neural network. The parameter search method includes a step of calculating a first action value function Q from the first model parameter variable by the neural network. The parameter search method includes a step of updating the first model parameter variable to a second model parameter variable by the control portion using the first action value function Q and outputting a third model parameter. The parameter search method includes a step of performing simulation by the circuit simulator using the second netlist and the third model parameter and outputting a second output result. The parameter search method includes a step of judging the second output result by the control portion using a convergence condition given to the second netlist. The parameter search method includes a step of setting a high reward by the control portion in the case where the second output result is close to the convergence condition and setting a low reward by the control portion in the case where the second output result is far from the convergence condition when the second output result is judged not to satisfy required characteristics of the second netlist. The parameter search method includes a step of calculating a second action value function Q from the second model parameter variable by the neural network. The parameter search method includes a step of updating a weight coefficient of the neural network by the neural network using an error calculated using the reward, the first action value function Q, and the second action value function Q. When the second output result is judged to satisfy the required characteristics of the second netlist, the first model parameter variable can be judged to be the best candidate for the second netlist.

In the above structure, the first netlist preferably includes any one of or a plurality of an inverter circuit, a source follower circuit, and a source-grounded circuit.

In the above structure, the number of first model parameter variables is preferably greater than or equal to two.

In the above structure, the number of units of output layers of the neural network is preferably twice or more as large as the number of model parameter variables.

In the above structure, the first output result extracted using the first netlist preferably includes any one of or a plurality of a leakage current, an output current, signal rise time, and signal fall time.

In the above structure, it is preferable that a semiconductor element used for the first netlist be a transistor whose semiconductor layer includes a metal oxide.

Effect of the Invention

One embodiment of the present invention can provide a parameter search method of a computerized netlist by utilizing a computer. Alternatively, one embodiment of the present invention can provide a parameter classification method that enables extraction of model parameters from a semiconductor element data set, learning of a group of model parameters by a classification model, and classification of the model parameters by the classification model. Alternatively, one embodiment of the present invention can provide a parameter selection method in which a model parameter that is suitable for required characteristics of a target netlist is selected by the parameter classification method. Alternatively, one embodiment of the present invention can provide a parameter search system in which search is performed using reinforcement learning so that a variable of a netlist supplied to a circuit simulator is the best candidate satisfying required characteristics of the netlist.

Note that the effects of one embodiment of the present invention are not limited to the effects listed above. The effects listed above do not preclude the existence of other effects. Note that the other effects are effects that are not described in this section and will be described below. The other effects that are not described in this section will be derived from the description of the specification, the drawings, and the like and can be extracted from the description by those skilled in the art. Note that one embodiment of the present invention is to have at least one of the effects listed above and/or the other effects. Therefore, one embodiment of the present invention does not have the effects listed above in some cases.

BRIEF DESCRIPTION OF THE DRAWINGS

FIG. 11 is a diagram showing a netlist in which an inverter circuit is written.

FIG. 12 is a diagram showing a user settings file.

MODE FOR CARRYING OUT THE INVENTION

Figure 1:
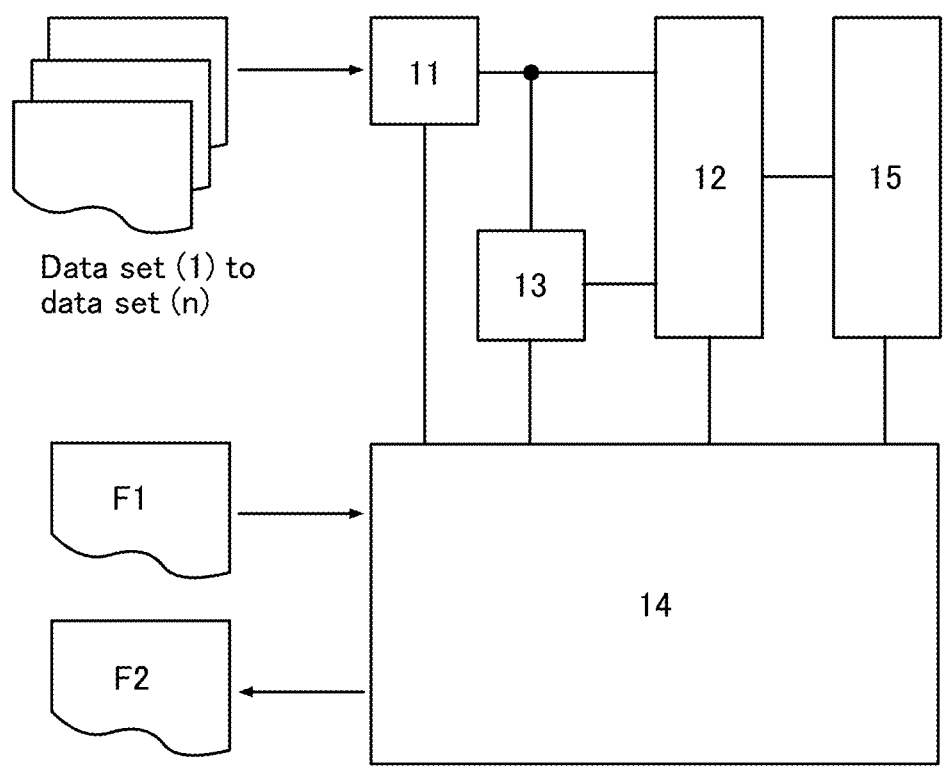
FIG. 1 is a block diagram illustrating a parameter search method.

Embodiments will be described in detail with reference to the drawings. Note that the present invention is not limited to the following description, and it will be readily understood by those skilled in the art that modes and details of the present invention can be modified in various ways without departing from the spirit and scope of the present invention. Therefore, the present invention should not be construed as being limited to the description of embodiments below.

Note that in structures of the present invention described below, the same reference numerals are used in common for the same portions or portions having similar functions in different drawings, and a repeated description thereof is omitted. Moreover, similar functions are denoted by the same hatch pattern and are not denoted by specific reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Embodiment

In one embodiment of the present invention, a parameter search method is described using FIG. 1 to FIG. 10.

The parameter search method is controlled by a program that operates on a computer. Thus, the computer can be referred to as a parameter search device with a parameter search method. Note that the parameter search device will be described in detail in FIG. 10. The program is stored in a memory included in the computer or a storage. Alternatively, the program is stored in a computer that is connected via a network (Local Area Network (LAN), Wide Area Network (WAN), the Internet, or the like) or a server computer including a database.

The parameter search method can search for the best candidate for a parameter using machine learning or reinforcement learning. For part of processing in the machine learning or the reinforcement learning, artificial intelligence (AI) is preferably used. In particular, the parameter search method can generate output data by using an artificial neural network (ANN, hereinafter simply referred to as a neural network). Arithmetic processing of the neural network is achieved with a circuit (hardware) or a program (software).

Note that a neural network refers to a general model that determines the connection strength of neurons by learning and has the capability of solving problems. The neural network includes an input layer, an intermediate layer (including a plurality of hidden layers in some cases), and an output layer. In the description of the neural network, to determine the connection strength of neurons (also referred to as a weight coefficient) from the existing information is referred to as "learning" in some cases.

First, a method for generating a classification model that performs machine learning is described. The classification model is generated by learning of a model parameter of a semiconductor element. The classification model classifies the model parameter. Note that the model parameter is extracted when a data set (including measurement data or a process parameter) of the semiconductor element is provided to a parameter extraction portion. However, classification that is suitable for required characteristics of a netlist is sometimes insufficient only with the model parameter of the semiconductor element.

In one embodiment of the present invention, the model parameter is further analyzed. In order to analyze the model parameter, simulation is performed by a circuit simulator using the model parameter and an evaluation netlist to which the model parameter is supplied. In the simulation, DC analysis, AC analysis, transient analysis, or the like is performed using the evaluation netlist. A simulation result includes any one of or a plurality of a leakage current, an output current, signal rise time, signal fall time, and the like in the evaluation netlist.

Thus, in one embodiment of the present invention, the model parameter and the simulation result using the evaluation netlist can be referred to as learning content. A method in which a classification model performs learning using learning content is referred to as a parameter learning method. The classification model can facilitate classification of a circuit focusing on low power consumption, a circuit focusing on operating frequency, a circuit stably operating in a specified frequency band, and the like, which cannot be sufficiently performed only with the parameter extraction portion. Note that in order to simplify the description, low power consumption, operating frequency, stability in a frequency band, and the like that are required for a circuit are sometimes referred to as required characteristics.

For example, in the case where a user requests the classification model to have a model parameter suitable for the circuit focusing on low power consumption, the classification model can provide a plurality of candidates from learned model parameters. In addition, a plurality of candidates can be provided from learned model parameters in an optionally specified range. Furthermore, in the case where new model parameters are supplied to the classification model, the classification model can show the probability of fitness of each of the new model parameters for any required characteristics. Accordingly, the user can obtain information to judge the fitness of the new model parameters for the required characteristics.

In other words, the classification model can provide a parameter selection method in which a model parameter that is suitable for the required characteristics is selected from the learned model parameters. Note that the required characteristics or the like may be added to the learning content.

For the classification model, machine learning algorithm that features class classification, such as a decision tree, Naive Bayes, K Nearest Neighbor (KNN), Support Vector Machine (SVM), perceptron, logistic regression, or a neural network, can be used.

Alternatively, a different classification model may be generated. For example, it is possible to generate a classification model that performs clustering by using a model parameter and a simulation result using an evaluation netlist. Machine learning algorithm such as K-means or density-based spatial clustering of applications with noise (BSCAN) can be used for clustering.

As a method for selecting learning content by the classification model, random sampling or cross variation can be used. Alternatively, it is possible to select a given number specified according to a sort order of numbers assigned to the learning content. Note that the learning content corresponds to the data set of the semiconductor element.

Note that the generated classification model can be stored in a main body of an electronic device or an external memory. The generated classification model may be used by being called at the time of classification of new files, and the classification model can be updated according to the above method while new learning content is added.

Next, a neural network performing reinforcement learning is described. Note that in one embodiment of the present invention, Q learning (Q-learning), a Monte Carlo method, or the like can be used. Note that in one embodiment of the present invention, an example in which Q learning is used is described.

First, Q learning is described. Q learning is a method in which the value of selection of an action $a_t$ by an agent at time t in a certain environment (denoted by a variable $s_t$) is learned. The agent means an agent that takes the action, and the variable $s_t$ means an object subjected to the action. By the action $a_t$ by the agent, the certain environment makes the transition from the variable $s_t$ to a variable $s_{t+1}$ and the agent receives a reward $r_{t+1}$. In the Q learning, the action $a_t$ is learned so as to maximize the total amount of obtained rewards in the end. The value of taking the action $a_t$ in the variable $s_t$ can be expressed as an action value function $Q(s_t,a_t)$. For example, an update formula of the action value function $Q(s_t,a_t)$ can be expressed by Formula (1). Note that in one embodiment of the present invention, the agent corresponds to a control portion, the certain environment corresponds to the variable $s_t$ supplied to an input layer of a neural network, and the action $a_t$ is determined by the action value function $Q(s_t,a_t)$ that is output to an output layer of the neural network from the agent.

[Formula 1]
$$Q(s_t, a_t) \leftarrow Q(s_t, a_t) + \alpha\left[r_{t+1} + \gamma\max_a Q(s_{t+1}, a) - Q(s_t, a_t)\right] \quad (1)$$

Here, α represents a learning rate (α is greater than 0 and less than or equal to 1) and γ represents a discount rate (γ is greater than or equal to 0 and less than or equal to 1). The learning rate α means which of the present value and the result obtained by an action is emphasized. As the learning rate α becomes closer to 1, the obtained result is more emphasized and a change in the value becomes larger. As the learning rate α becomes closer to 0, the present value is more emphasized and a change in the value becomes smaller. The discount rate γ means which of the present reward and a future reward is emphasized. As the discount rate γ becomes closer to 0, the present reward is more emphasized. As the discount rate γ becomes closer to 1, the future reward is more emphasized. For example, the learning rate α can be 0.10 and the discount rate γ can be 0.90.

In general, in the Q learning, a combination of a state $s_t$ and the action $a_t$ of the action value function $Q(s_t,a_t)$ that is output from the neural network is stored as data in advance as a look-up table (LUT). Note that in one embodiment of the present invention, the look-up table can be referred to as an action table. In addition, the number of units of the action value function $Q(s_t,a_t)$ output from the neural network is preferably twice or more as large as the number of units of the neural network supplied with the variable $s_t$. Furthermore, each action for the combination of the variable $s_t$ and the action $a_t$ is preferably set in the action table. In the Q learning, an action that is linked to a combination where the action value function $Q(s_t,a_t)$ has the maximum value is executed. Note that an action value function Qmax1 means a combination of the state $s_t$ and the action $a_t$ where the action value function $Q(s_t,a_t)$ has the maximum value at the time t.

[Formula 2]
$$E = r_{t+1} + \gamma\max_a Q(s_{t+1}, a) - Q(s_t, a_t) \quad (2)$$

In the Q learning, an error E can be expressed by Formula (2). The term $r_{t+1}$ is a reward obtained by learning at the time t. The term $\max Q(s_{t+1},a)$ corresponds to an action value function Qmax2 where the variable $s_t$ is updated in accordance with an action determined by a correct label and calculation is performed again by the neural network. Note that the term $\max Q(s_{t+1},a)$ may be $\max Q(s_{t+1},a_{t+1})$. Note that the term $Q(s_t,a_t)$ corresponds to the action value function Qmax1.

Note that a loss function L is calculated from the error E. As a method for calculating the loss function L, a square error can be used. With the use of stochastic gradient descent (SGD), a weight coefficient of the neural network can be updated such that the value of the loss function L becomes small. Besides stochastic gradient descent, Adaptive Moment Estimation (Adam), Momentum, Adaptive SubGradient Methods (AdaGrad), RMSProp, or the like can be used. In other words, the weight coefficient of the neural network is updated in accordance with the loss function L.

The variable $s_t$ is updated to the variable $s_{t+1}$, and calculation of a neural network 15 is performed again. In the Q learning, learning is performed repeatedly so that the loss function L becomes as small as possible.

Next, the parameter search method is described using FIG. 1. Note that in the following description, the parameter search method is sometimes referred to as a parameter search device 10.

The parameter search device 10 includes a parameter extraction portion 11, a circuit simulator 12, a classification model 13, a control portion 14, and the neural network 15. Note that a data set of a semiconductor element and a setup file F1 are provided to the parameter search device 10, and the parameter search device 10 outputs output data F2. The parameter extraction portion 11, the circuit simulator 12, the classification model 13, the control portion 14, and the neural network 15 are controlled by a program that operates on a computer.

Note that the data set of the semiconductor element, the setup file F1, and the output data F2 are preferably stored in a memory included in the computer or a storage. Alternatively, the data set of the semiconductor element may be stored in a computer connected via a network, a server computer including a database, a memory included in measurement equipment, or a storage. In addition, in parameter search by the parameter search device 10, a computer where the control portion 14 operates may be different from a computer (including a server computer) where the parameter extraction portion 11, the circuit simulator 12, or the classification model 13 operates.

Measurement data or a process parameter of the semiconductor element is provided to the parameter extraction portion 11 as a data set. Note that the parameter extraction portion 11 can load a data set instructed by the control portion 14. Alternatively, in the case where the parameter extraction portion 11 detects a new data set in the memory in the computer or the storage, the parameter extraction portion 11 can load the new data set automatically. The parameter extraction portion 11 extracts a model parameter from the data set.

An evaluation netlist is provided to the circuit simulator 12 from the control portion 14. The evaluation netlist will be described in detail in FIG. 7.

The circuit simulator 12 performs simulation by using the evaluation netlist and the model parameter and outputs a simulation result as a first output result. In the simulation, DC analysis, AC analysis, transient analysis, or the like is performed. Thus, the first output result includes at least any one of or a plurality of a leakage current, an output current, signal rise time, signal fall time, and the like in the evaluation netlist. The classification model 13 can learn the model parameter and the first output result, and can classify the model parameter. Note that in the case where there are a plurality of evaluation netlists, the evaluation netlists are sequentially updated, and the circuit simulator 12 outputs the first output result by using the plurality of evaluation netlists.

A netlist and a model parameter classified as being suitable for required characteristics of the netlist are provided to the circuit simulator 12 from the control portion 14. Note that the netlist is circuit information for obtaining the model parameter suitable for the required characteristics. Note that the netlist includes a plurality of semiconductor elements. However, in one embodiment of the present invention, it is possible to select a model parameter to be adjusted from the semiconductor elements included in the netlist as a model parameter variable.

Note that the circuit simulator is initialized by the control portion 14. Initialization information is supplied to the control portion 14 from the setup file F1. The setup file F1 includes information on the magnitude of power supply voltage needed for simulation, the maximum value and the minimum value of the model parameter, the process parameter, and the like. Note that the initialization information may be supplied by user's voice through a keyboard, a mouse, or a microphone.

A model parameter variable is supplied to the neural network 15 from the control portion 14. The model parameter variable is a model parameter of the semiconductor element whose best candidate is to be searched by the neural network 15. The neural network 15 supplies the supplied model parameter variable to an input layer as the variable $s_t$ at the time t. The neural network 15 outputs the action value function $Q(s_t, a_t)$ from the variable $s_t$. The control portion 14 updates the model parameter variable by the action value function $Q(s_t, a_t)$. The circuit simulator 12 performs simulation by using the netlist and a model parameter including the updated model parameter variable. The circuit simulator 12 outputs a second output result.

The control portion 14 judges the second output result. In the case where the second output result does not satisfy the required characteristics of the netlist, the control portion sets a reward for the second output result and calculates a loss function. In the neural network 15, a weight coefficient of the neural network 15 is updated by the loss function. Note that in the case where the second output result satisfies the required characteristics of the netlist, the model parameter variable is judged to be the best candidate for the netlist. Note that the best candidate for the model parameter variable is preferably output to the output data F2 as a list.

Unlike the above method, the netlist and the model parameter may be provided to the circuit simulator 12 from the control portion 14. Note that the model parameter in that case does not necessarily satisfy the required characteristics of the netlist. However, in the case where the second output result does not satisfy the required characteristics of the netlist, the weight coefficient of the neural network is updated using the loss function. In addition, in the circuit simulator 12, the model parameter is updated by the classification model to any one of the model parameters classified as satisfying required characteristics of a second netlist. The circuit simulator 12 searches for a parameter to be the best candidate by using model parameters in a wider range.

Figure 2:
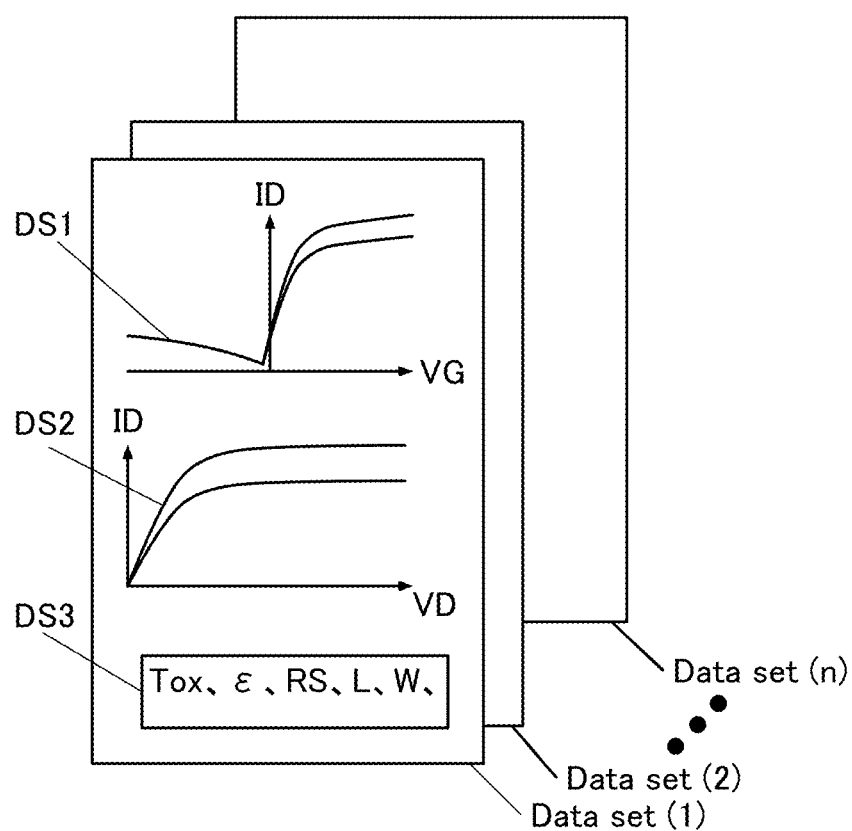
FIG. 2 illustrates a data set.

FIG. 2 is a diagram illustrating the data set of the semiconductor element. The data set includes measurement data DS1, measurement data DS2, or a process parameter DS3 of the semiconductor element. For example, the semiconductor element is a transistor, a resistor, a capacitor, a diode, or the like. Note that the semiconductor element may be formed using a combination with a transistor, a resistor, a capacitor, a diode, or the like.

In FIG. 2, the case where the semiconductor element is a transistor is described. The measurement data DS1 shows the case where different fixed voltages are applied to a source and a drain of the transistor and a voltage applied to a gate of the transistor is swept. Accordingly, the measurement data DS1 is measurement data where a horizontal axis shows a gate voltage VG of the transistor and a vertical axis shows a drain current ID flowing through the drain of the transistor. Note that although the measurement data DS1 is shown in a graph in FIG. 2, this is for easy understanding of the measurement data, and the measurement data DS1 is data recorded in numbers in the data set.

The measurement data DS2 shows the case where different fixed voltages are applied to the source and the gate of the transistor and a voltage applied to the drain of the transistor is swept. Accordingly, the measurement data DS2 is measurement data where a horizontal axis shows a drain voltage VD of the transistor and a vertical axis shows the drain current ID flowing through the drain of the transistor. Note that although the measurement data DS2 is shown in a graph in FIG. 2, this is for easy understanding of the measurement data, and the measurement data DS2 is data recorded in numbers in the data set.

Note that the measurement data DS1 or the measurement data DS2 preferably includes a plurality of pieces of measurement data measured under different conditions. For example, in the measurement data DS1, different fixed voltages are preferably applied as the drain voltages VD of the transistor. In addition, in the measurement data DS2, different fixed voltages are preferably applied as the gate voltages VG of the transistor.

The process parameter DS3 is the process parameter of the semiconductor element. The process parameter includes thickness Tox of an oxide film, a dielectric constant ε of the oxide film, resistivity RS of a conductive film, channel length L, channel width W, and the like.

FIG. 3 to FIG. 6 are flow charts each showing a parameter search method. The parameter search method includes first processing and second processing. In the first processing, extraction of the model parameter of the semiconductor element by the parameter extraction portion 11 and parameter learning of the model parameter by the classification model 13 are performed. In the second processing, the best candidate for the model parameter variable of the semiconductor element included in the netlist is searched by Q learning using the model parameter selected by the classification model.

Figure 3:
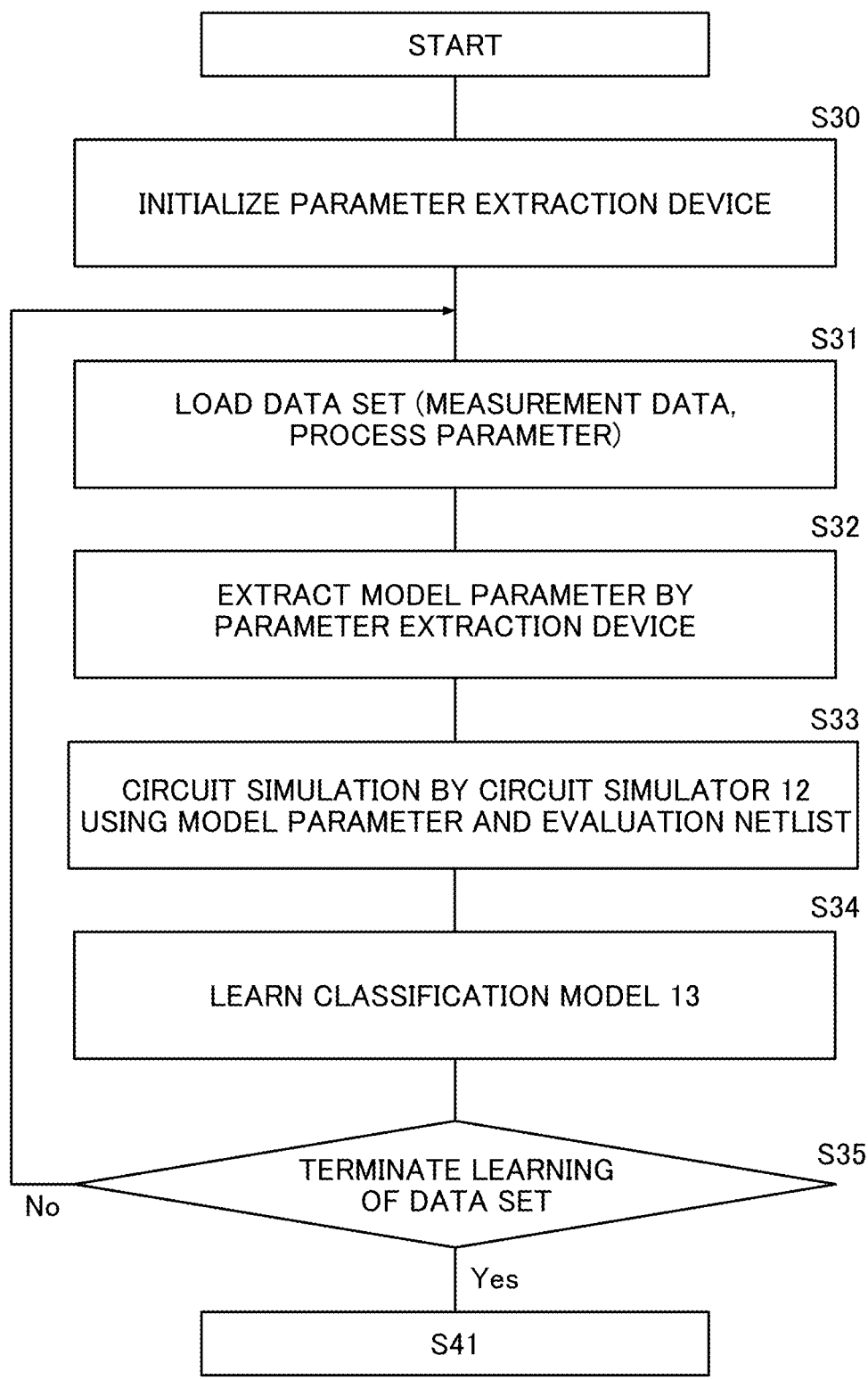
FIG. 3 is a flow chart showing a parameter search method.

In FIG. 3, extraction of the model parameter by the parameter extraction portion 11 and classification of the model parameter by the classification model 13 are described using the flow chart.

Step S30 is a step of initializing the parameter extraction portion 11 by the control portion 14. Common items of measurement data to be loaded are supplied to the parameter extraction portion 11. Specifically, a voltage supplied to the source, the drain, or the gate of the transistor, a process parameter, and the like are supplied to the parameter extraction portion 11.

Step S31 is a step of loading a data set including the measurement data, the process parameter, and the like of the semiconductor element into the parameter extraction portion.

Step S32 is a step of extracting the model parameter by the parameter extraction portion 11. For example, the model parameter of the transistor includes physical parameters such as the threshold voltage with respect to channel length and channel width, oxide film thickness, drain resistance, source resistance, junction capacitance, a noise figure, mobility, and channel length modulation, and the measurement data is represented by function expression. Note that the user is preferably capable of setting items to be controlled by the model parameter.

Step S33 includes a step of providing an evaluation netlist to the circuit simulator 12 from the control portion 14 and supplying a model parameter to the circuit simulator from the parameter extraction portion 11. In addition, the circuit simulator 12 performs simulation using the evaluation netlist. The circuit simulator 12 outputs a simulation result as the first output result.

Note that the number of evaluation netlists is not limited to one, and plural kinds of evaluation netlist may be used. For example, the evaluation netlist includes an inverter circuit, a source follower circuit, a source-grounded circuit, a charge pump circuit, a ring oscillator circuit, a current mirror circuit, an amplifier circuit, or the like. The first output result corresponding to circuit features can be obtained from the above evaluation netlist.

For example, a leakage current, an output current, rise time, fall time, or the like is obtained from the inverter circuit as the first output result. For example, a circuit output current or the like is obtained from the source follower circuit as the first output result. A circuit leakage current, a sink current, or the like is obtained from the source-grounded circuit as the first output result. In addition, the charge pump circuit, the ring oscillator circuit, the current mirror circuit, the amplifier circuit, or the like can be used as the evaluation netlist. The charge pump circuit, the ring oscillator circuit, the current mirror circuit, the amplifier circuit, or the like has a circuit configuration having a combination with the inverter circuit, the source follower circuit, or the source-grounded circuit, and can obtain the first output result having features close to required characteristics of a netlist to be subjected to model parameter verification.

As an example, the inverter circuit that is used as the evaluation netlist is described in detail. The inverter circuit may be formed using a p-channel transistor and an n-channel transistor, or may be formed using only either p-channel transistors or n-channel transistors. For example, in the case where the inverter circuit is formed using only n-channel transistors, semiconductor layers of the n-channel transistors preferably include a metal oxide. Alternatively, different inverter circuits may have a structure in which a semiconductor layer of an n-channel transistor includes a metal oxide and a semiconductor layer of a p-channel transistor includes silicon.

Step S34 is a step of supplying the model parameter and the first output result to the classification model 13 and then performing learning by the classification model. The classification model can learn the model parameter and the first output result, and can classify the model parameter.

Step S35 is a step of judging, by the control portion 14, whether data set learning for the classification model 13 has terminated. When the control portion 14 judges that all the data set learning for the classification model 13 has terminated, the process goes to Step S41. When the control portion 14 judges that there is still an unlearned data set, the process returns to Step S31 and learning for the classification model continues.

Figure 4:
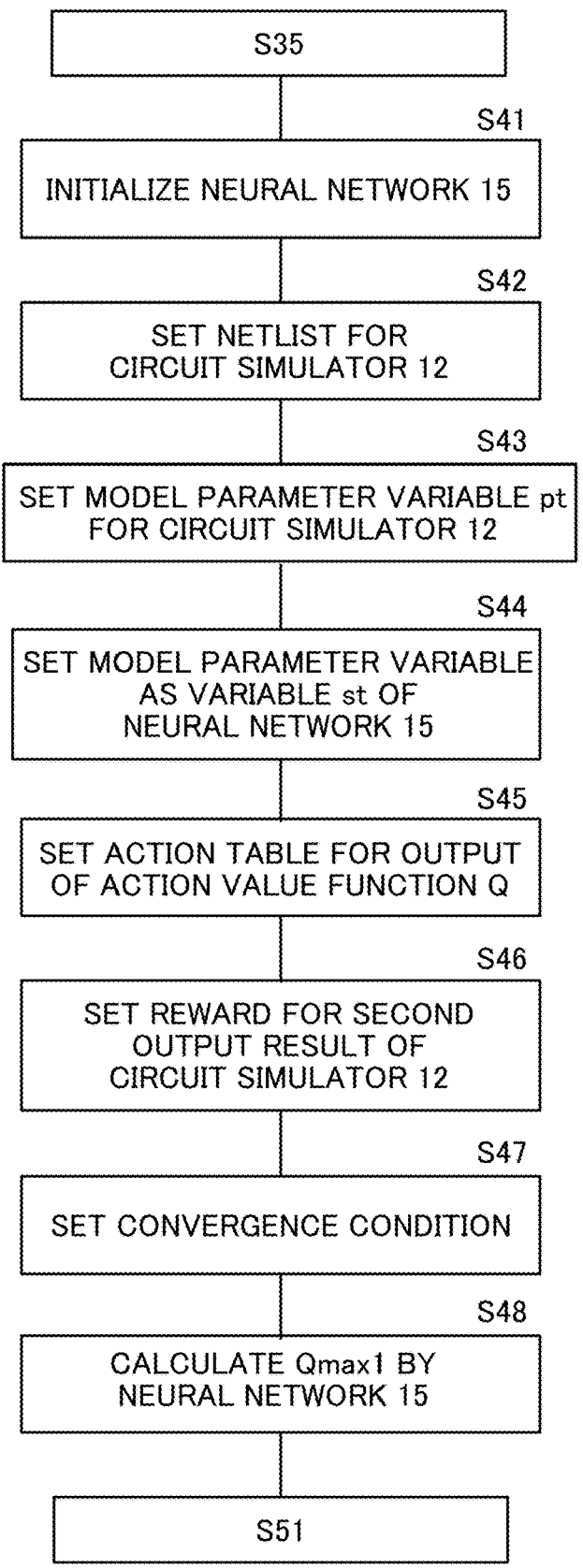
FIG. 4 is a flow chart showing a parameter search method.
Figure 5:
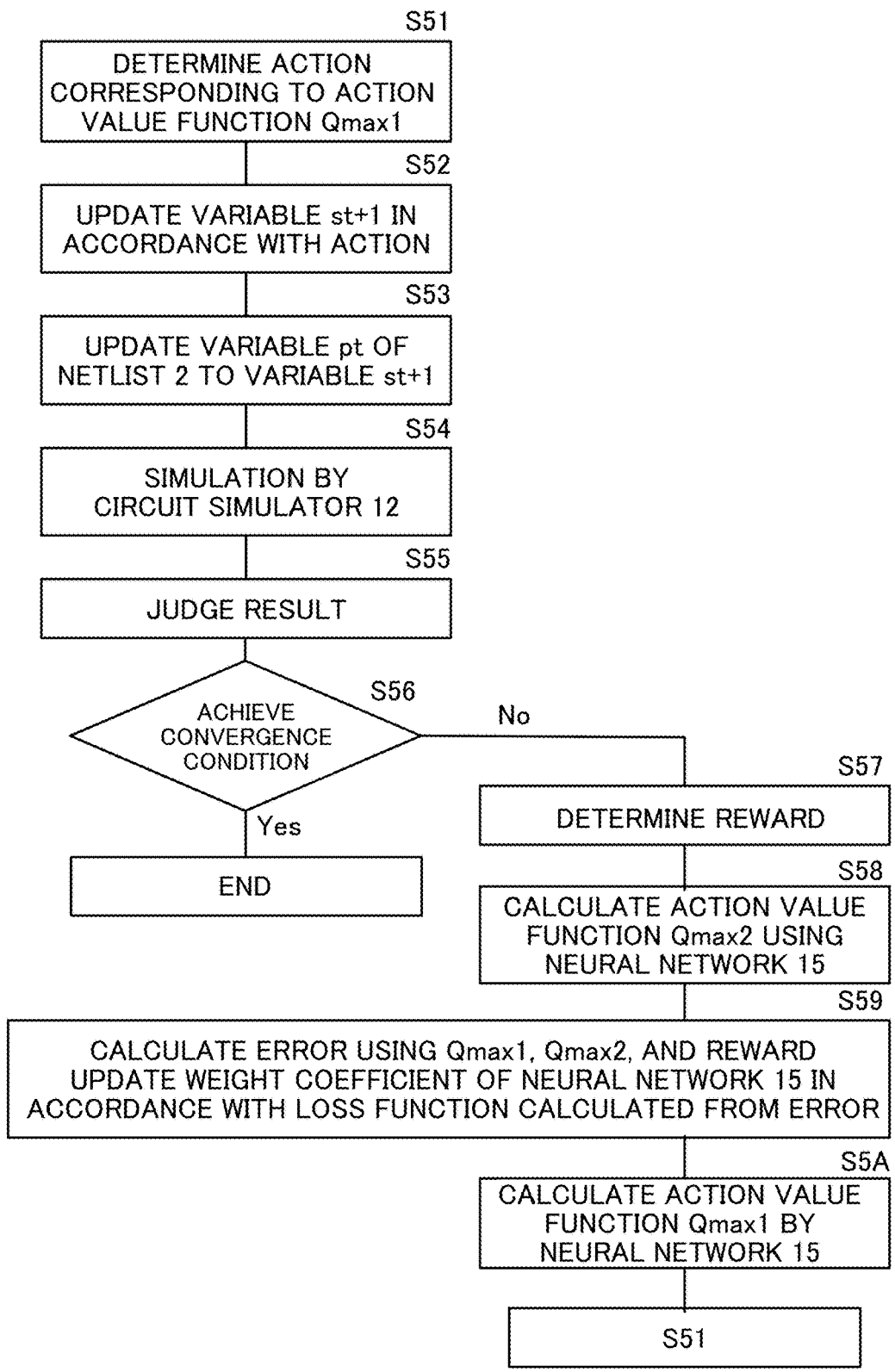
FIG. 5 is a flow chart showing a parameter search method.
Figure 6:
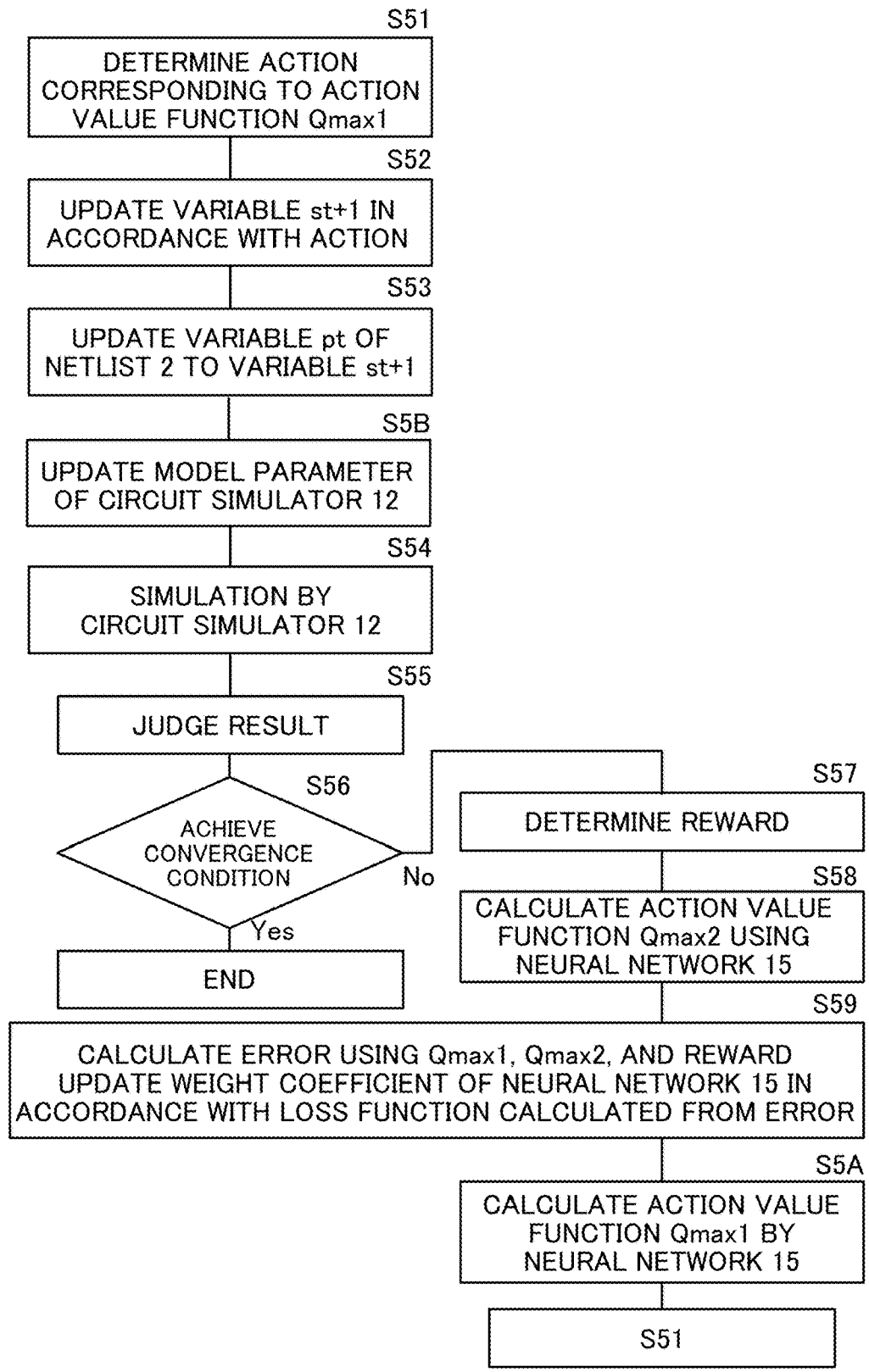
FIG. 6 is a flow chart showing a parameter search method.

FIG. 4 to FIG. 6 are flow charts showing the second processing. In the second processing in the parameter search method, parameter search is performed using Q learning. Note that in order to perform the Q learning, the circuit simulator 12 and the neural network 15 need to be initialized. In FIG. 4, initialization for the Q learning is described using the flow chart.

Step S41 is a step of initializing the neural network 15. Note that the neural network 15 can be initialized by giving a random number to the weight coefficient of the neural network 15. Alternatively, the neural network 15 may load a weight coefficient obtained at the time of the past learning.

Step S42 is a step of providing a netlist to the circuit simulator 12. Note that the netlist is a netlist where the user searches for a model parameter.

Step S43 is a step of setting a model parameter and a model parameter variable pt where the best candidate is to be searched from model parameters for the circuit simulator 12 by the control portion 14. Note that the control portion 14 can select a model parameter suitable for the required characteristics of the netlist by using a classification result of the classification model.

Step S44 is a step of setting the model parameter variable pt as the variable $s_t$ of the neural network 15.

Step S45 is a step of setting an action table for the action value function $Q(s_t, a_t)$ that is the output of the neural network 15. Note that the action value function $Q(s_t, a_t)$ includes a plurality of outputs corresponding to the number of units of output layers of the neural network 15. Accordingly, in the action table, actions corresponding to outputs of the action value function $Q(s_t, a_t)$ are preferably set.

As an example, the case where transistor channel length is denoted by L, transistor channel width is denoted by W, and a variable $s_t(L,W)$ is supplied as a model parameter variable is described. In the case where the model parameter variable is the variable $s_t(L,W)$, the number of input units of the neural network 15 is preferably the same as the number of model parameter variables. The number of output units of the neural network 15 is preferably twice or more as large as the number of input units of the neural network 15. Accordingly, an action value function Q can be represented by four outputs of an action value function $Q(s_t, a_t = a_1 \text{ to } a_4)$.

Different actions are set for the action value function $Q(s_t, a_t = a_1 \text{ to } a_4)$. For the action value function $Q(s_t, a_t = a_1 \text{ to } a_4)$, for example, the larger channel length L can be set as an action $a_1$; the smaller channel length L can be set as an action $a_2$; the larger channel width W can be set as an action $a_3$; and the smaller channel width W can be set as an action $a_4$. Note that in the following description, the maximum value of the action value function $Q(s_t, a_t)$ in the variable $s_t$ is set as action value function Qmax1, and an action that is linked to the action value function Qmax1 is executed. Note that in the case where the action value function $Q(s_t, a_t)$ has four or more outputs, more detailed actions can be set.

In addition, the user is preferably capable of setting an actionable range. As an example, the channel length Z that one of the model parameter variables is described. The allowable range of the channel length L is determined by manufacturing equipment specifications. For example, in the case where the channel length L is set to larger than or equal to 10 nm and smaller than or equal to 1 μm, when an action of decreasing the channel length L continues, the channel length L sometimes becomes smaller than 10 nm that is the lower limit of setting. For example, in the case where the channel length L becomes smaller than 10 nm that is the lower limit, the channel length L can be fixed to 10 nm that is the lower limit. Alternatively, in the case where the channel length L becomes smaller than 10 nm that is the lower limit, the channel length L can be set to smaller than or equal to 1 μm that is the maximum value.

In Step S46, a Q learning reward is set. The reward is given when the second output result does not satisfy a convergence condition. In the case where the second output result becomes closer to the convergence condition, a high reward is given. In the case where the second output result becomes farther from the convergence condition, a low reward is given. Note that the reward size may be set to a fixed value depending on the distance from the convergence condition, or the user may be capable of setting the reward size.

Step S47 is a step of setting a convergence condition for the Q learning.

Step S48 is a step of calculating the action value function Qmax1 from the variable $s_t$ supplied to the neural network 15. Then, the process goes to Step S51 in FIG. 5.

FIG. 5 is a flow chart showing reinforcement learning using Q learning.

Step S51 is a step of determining an action corresponding to the action value function Qmax1 that is the output of the neural network 15.

Step S52 is a step of updating the variable $s_t$ to the variable $s_{t+1}$ depending on the action corresponding to the action value function Qmax1. Note that the variable $s_{t+1}$ is supplied to the neural network 15.

Step S53 is a step of updating the model parameter variable pt of the netlist to the variable $s_{t+1}$.

Step S54 is a step of performing simulation by the circuit simulator 12 using the netlist and a model parameter with the updated model parameter variable pt. The circuit simulator 12 outputs a simulation result as the second output result.

Step S55 is a step of judging, by the control portion 14, whether the second output result satisfies the convergence condition given to the netlist.

In Step S56, in the case where the control portion 14 judges that the second output result satisfies the convergence condition given to the netlist, the reinforcement learning using the neural network 15 is terminated. Accordingly, in that case, the second output result is one of the best candidates suitable for the required condition of the netlist. Note that as a method for further searching for the best candidate for the parameter variable that is suitable for the required condition of the netlist, even though the second output result satisfies the convergence condition, the learning may continue without termination of a loop. In that case, conditions that are close to the convergence condition can be intensively searched. Alternatively, the process can go to Step 41 so that the neural network 15 can be initialized with a different random number and reinforcement learning can be performed. Alternatively, the process can go to Step 41 so that the reinforcement learning can be performed using a different model parameter.

Step S57 is a step of determining the Q learning reward. For example, there is a step of setting a high reward by the control portion in the case where the second output result is close to the convergence condition and setting a low reward by the control portion in the case where the second output result is far from the convergence condition when the second output result is judged not to satisfy the required characteristics of the second netlist.

Step S58 is a step of calculating the action value function Qmax2 using the variable $s_{t+1}$ supplied to the neural network 15. Note that the action value function Qmax2 corresponds to the maximum value of an action value function $Q(s_{t+1}, a_{t+1} = a_{1 \text{ to } 4})$ in the variable $s_{t+1}$.

Step S59 is a step of updating the weight coefficient of the neural network 15. The weight coefficient is updated in accordance with a loss function that is calculated by the error E calculated using the action value function Qmax1, the action value function Qmax2, and the reward.

Step S5A is a step of calculating the action value function Qmax1 from the variable $s_{t+1}$ supplied to the neural network 15. Then, the process goes to Step S51 in FIG. 5, and an action corresponding to the action value function Qmax1 that is the output of the neural network 15 is determined.

FIG. 6 is a flow chart showing reinforcement learning using Q learning, which is different from FIG. 5. Points of FIG. 6 different from those of FIG. 5 are described; and in the structure of the invention (or the structure in an example), the same reference numerals are used in common for the same portions or portions having similar functions in different drawings, and a repeated description thereof is omitted.

In FIG. 6, there is Step S5B of updating the model parameter of the circuit simulator 12 after updating the variable $s_t$ to the variable $s_{t+1}$ (Step S52) by the action corresponding to the action value function Qmax1. For example, in the case where the model parameter variable goes beyond the actionable range by the action in Step S51, the model parameter is updated. Note that the model parameter is preferably classified by the classification model 13 and within a range classified as being suitable for the required characteristics of the netlist. With update of the model parameter, the Q learning can perform parameter search in a wider range.

As described above, in the parameter search method according to one embodiment of the present invention, a plurality of model parameter variables can be selected from a plurality of model parameters of semiconductor elements included in the netlist, and the best candidate for a model parameter variable suitable for the required characteristics of the netlist can be searched.

In addition, in the parameter search method, when the classification model learns a model parameter extracted by the classification model from the parameter extraction portion and the first output result obtained by the circuit simulator using the evaluation netlist, a model parameter suitable for the required characteristics of the netlist can be classified.

The classification model can select a model parameter suitable for the required characteristics of the netlist; thus, the Q learning can be performed efficiently. For example, the classification model can be employed in the case where an optimal process condition is considered from process parameter conditions. In addition, the classification model can also be employed for extraction of a model parameter corresponding to the required characteristics of the netlist.

FIG. 7A to FIG. 7D are circuit diagrams each illustrating an evaluation netlist. Note that the evaluation netlist includes a capacitor 64 as an output load in a circuit output stage. Accordingly, an output signal of the evaluation netlist can judge whether to satisfy the required characteristics of the evaluation netlist using a voltage generated by charging and discharging of the capacitor 64.

Figure 7A:
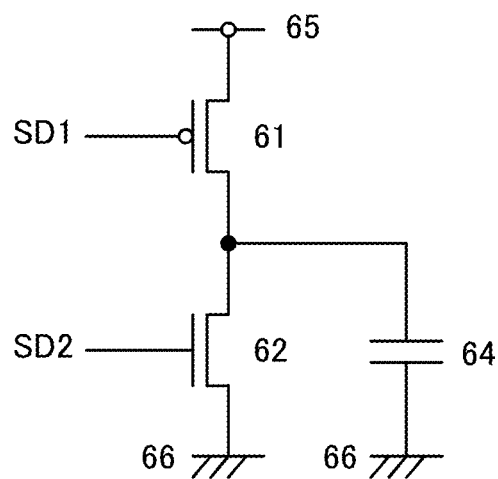
FIG. 7A to FIG. 7D are diagrams each illustrating an evaluation netlist.

FIG. 7A is a circuit diagram illustrating an inverter circuit. The inverter circuit includes a transistor 61, a transistor 62, a wiring 65, a wiring 66, a wiring SD1, and a wiring SD2. Note that the transistor 61 is a p-channel transistor and the transistor 62 is an n-channel transistor.

One of a source and a drain of the transistor 61 is electrically connected to the wiring 65. The other of the source and the drain of the transistor 61 is electrically connected to one of a source and a drain of the transistor 62 and one electrode of the capacitor 64. The other of the source and the drain of the transistor 62 is electrically connected to the wiring 66. The other electrode of the capacitor 64 is electrically connected to the wiring 66. A gate of the transistor 61 is electrically connected to the wiring SD1. A gate of the transistor 62 is electrically connected to the wiring SD2.

A signal supplied to the wiring SD1 is the same as a signal supplied to the wiring SD2. Thus, an on state and an off state of the transistor 61 are switched complementarily with the transistor 62. In the case where the transistor 61 is changed from the off state to the on state, the transistor 62 is changed from the on state to the off state.

The leakage current of the inverter circuit can be estimated by DC analysis using the circuit simulator. In addition, the inverter circuit can estimate the amount of shoot-through current flowing through the inverter circuit, operating frequency, or the rise time and fall time of an output signal by transient analysis using the circuit simulator.

The transistor 61 or the transistor 62 each preferably includes silicon for a semiconductor layer. Note that the transistor 62 may each include a metal oxide for the semiconductor layer.

Figure 7B:
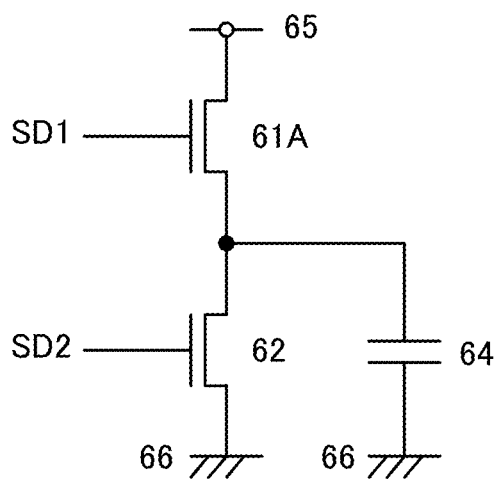

FIG. 7B is a circuit diagram illustrating an inverter circuit, which is different from FIG. 7A. Points of FIG. 7B different from those of FIG. 7A are described; and in the structure of the invention (or the structure in the example), the same reference numerals are used in common for the same portions or portions having similar functions in different drawings, and a repeated description thereof is omitted.

In the inverter circuit illustrated in FIG. 7B, a transistor 61A and the transistor 62 are n-channel transistors.

As a signal supplied to the wiring SD1, an inverted signal of the signal supplied to the wiring SD2 is supplied. The signal supplied to the wiring SD1 switches an on state and an off state of the transistor 61A. The signal supplied to the wiring SD2 switches the on state and the off state of the transistor 62. Through the above operations, DC analysis and transient analysis using the circuit simulator can be performed.

The transistor 61A and the transistor 62 each preferably include silicon for a semiconductor layer. Alternatively, the transistor 61A and the transistor 62 may each include a metal oxide for the semiconductor layer.

Figure 7C:
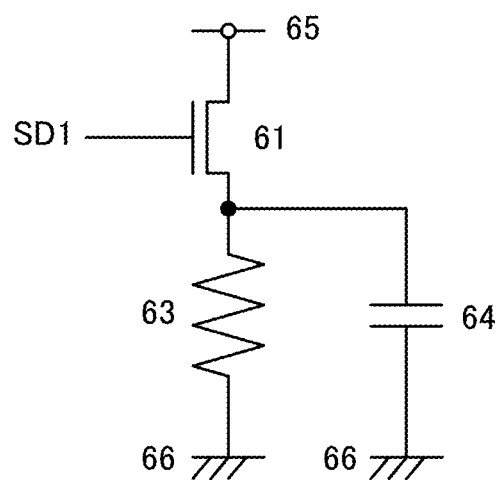

FIG. 7C is a circuit diagram illustrating a source follower circuit. The source follower circuit includes the transistor 61, a resistor 63, the wiring 65, the wiring 66, and the wiring SD1. Note that in the source follower circuit in FIG. 7C, an example in which the transistor 61 is an n-channel transistor is shown. Note that the source follower circuit sometimes functions as a buffer circuit (a current amplifier circuit). Note that for the resistor 63, a transistor or a diode can be used as an active load.

The one of the source and the drain of the transistor 61 is electrically connected to the wiring 65. The other of the source and the drain of the transistor 61 is electrically connected to one electrode of the resistor 63 and one electrode of the capacitor 64. The other electrode of the resistor 63 is electrically connected to the wiring 66. The other electrode of the capacitor 64 is electrically connected to the wiring 66. The gate of the transistor 61 is electrically connected to the wiring SD1.

The signal supplied to the wiring SD1 can switch the on state (a strong inversion region) or the off state (a weak inversion region) of the transistor 61. In the case where the transistor 61 is set in the on state by the signal supplied to the wiring SD1, an output potential applied to the capacitor 64 is a potential that is lower than a potential of the signal supplied to the wiring SD1 by the threshold voltage of the transistor 61.

The source follower circuit can estimate a bias current of the source follower circuit and the threshold voltage of the transistor 61 by DC analysis using the circuit simulator. In addition, frequency characteristics of the source follower circuit can be estimated by AC analysis using the circuit simulator. Furthermore, the source follower circuit can estimate the amount of change in the bias current flowing through the source follower circuit or the rise time and fall time of an output signal by transient analysis using the circuit simulator.

The transistor 61 preferably includes silicon for the semiconductor layer. Note that the transistor 61 may include a metal oxide for the semiconductor layer. Note that the transistor 61 may be a p-channel transistor. Inversion of a power supply voltage applied to the wiring 65 and the wiring 66 can form the source follower circuit using a p-channel transistor.

Figure 7D:
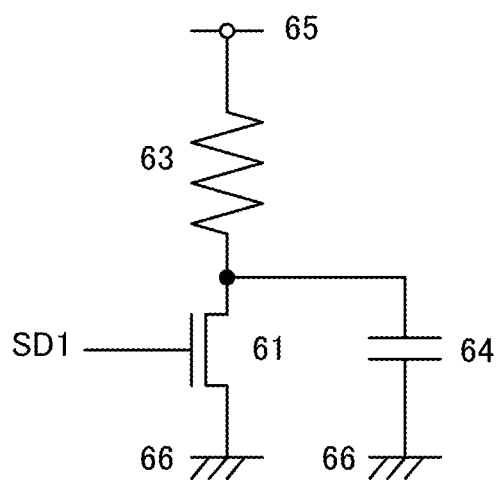

FIG. 7D is a circuit diagram illustrating a source-grounded circuit. The source-grounded circuit includes the transistor 61, the resistor 63, the wiring 65, the wiring 66, and the wiring SD1. Note that in the source-grounded circuit in FIG. 7D, an example in which the transistor 61 is an n-channel transistor is shown.

The one electrode of the resistor 63 is electrically connected to the wiring 65. The other electrode of the resistor 63 is electrically connected to the one of the source and the drain of the transistor 61 and the one electrode of the capacitor 64. The other of the source and the drain of the transistor 61 is electrically connected to the wiring 66. The other electrode of the capacitor 64 is electrically connected to the wiring 66. The gate of the transistor 61 is electrically connected to the wiring SD1.

The signal supplied to the wiring SD1 can switch the on state or the off state of the transistor 61. The source-grounded circuit functions as an amplifier circuit. The signal supplied to the wiring SD1 is amplified by the transistor 61 and is used for charging and discharging of the capacitor 64.

The source-grounded circuit can estimate a bias current of the source-grounded circuit and the value of sink current at the time of amplification by DC analysis using the circuit simulator. In addition, frequency characteristics of the source-grounded circuit can be estimated by AC analysis using the circuit simulator. Furthermore, the source-grounded circuit can estimate the amount of change in the bias current flowing through the source-grounded circuit, an amplification rate for an input signal, and variation in the threshold voltage of the transistor 61 by transient analysis using the circuit simulator.

The transistor 61 preferably includes silicon for the semiconductor layer. Note that the transistor 61 may include a metal oxide for the semiconductor layer. Note that the transistor 61 may be a p-channel transistor. Inversion of a power supply voltage applied to the wiring 65 and the wiring 66 can form the source-grounded circuit using a p-channel transistor.

Note that an analysis result obtained by the evaluation netlist illustrated in FIG. 7A to FIG. 7D corresponds to the first result. Note that the evaluation netlist is not limited to that in FIG. 7A to FIG. 7D. A charge pump circuit, a ring oscillator circuit, a current mirror circuit, an amplifier circuit, or the like has a circuit configuration having a combination with the inverter circuit, the source follower circuit, or the source-grounded circuit, and can obtain the first output result that is close to a netlist to be subjected to actual verification.

Figure 8:
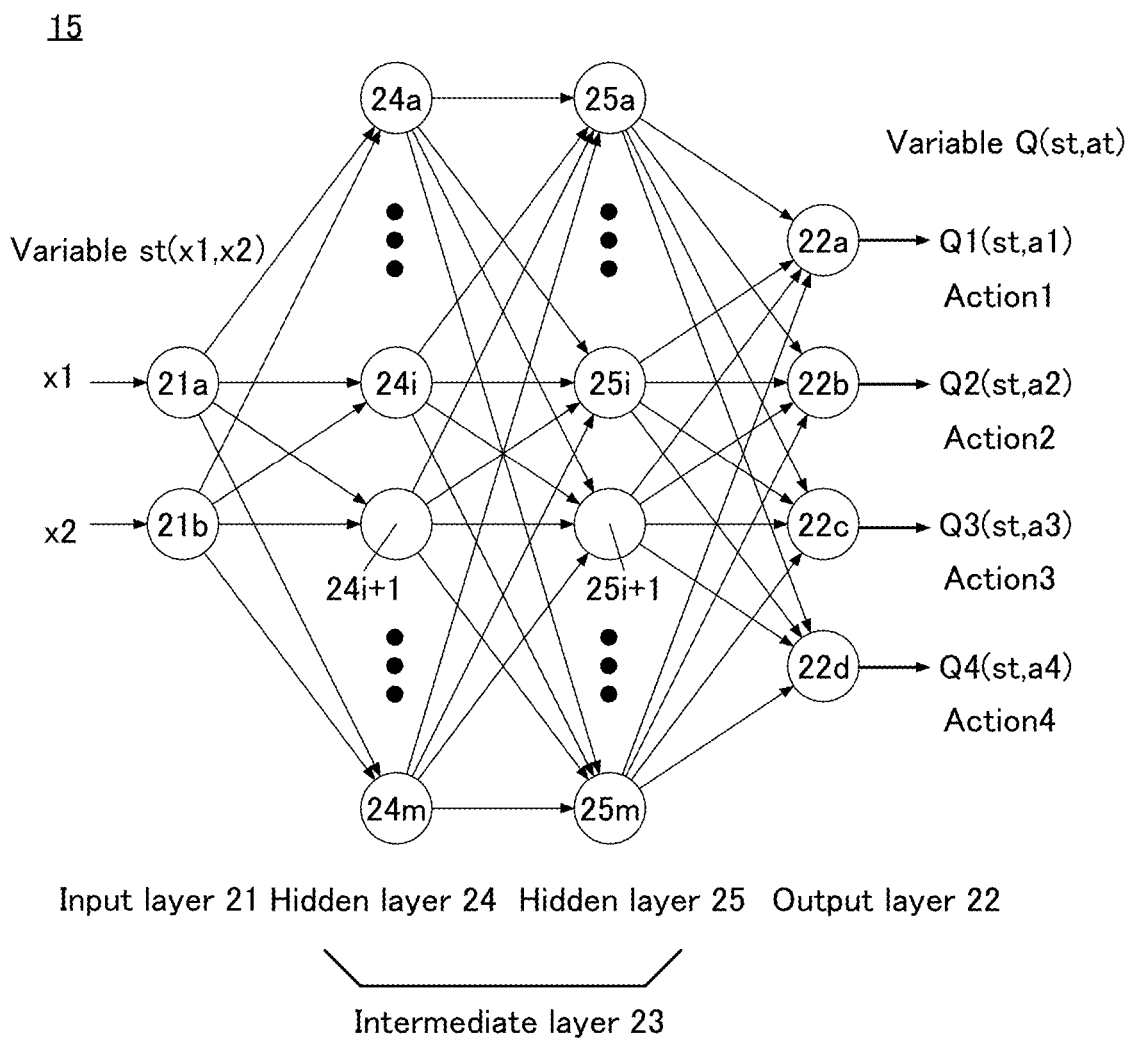
FIG. 8 is a schematic diagram illustrating a neural network.

FIG. 8 is a schematic diagram illustrating the neural network 15 in Q learning. For example, a fully connected neural network is used as the neural network 15. Note that the neural network 15 is not limited to the fully connected neural network. The neural network 15 includes an input layer 21, an intermediate layer 23, and an output layer 22. For example, in FIG. 8, the intermediate layer 23 includes a hidden layer 24 (hidden layers 24*a* to 24*m*) and a hidden layer 25 (hidden layers 25*a* to 25*m*). Note that the number of hidden layers included in the intermediate layer 23 is not limited to two. The intermediate layer 23 can include two or more hidden layers as needed. In addition, the number of units included in the hidden layer may vary depending on the hidden layer. Note that the number of units included in the hidden layer represents the hidden layers 24*a* to 24*m*, as illustrated in FIG. 8.

The variable $s_t$ that is input data at the time t is supplied to the input layer 21. The output layer 22 outputs the action value function $Q(s_t,a_t)$. Note that the number of output units of the neural network 15 according to one embodiment of the present invention is preferably twice or more as large as the number of input units of the neural network 15. For example, in FIG. 8, the input layer 21 includes a unit 21*a* and a unit 22*b* and the output layer 22 includes a unit 22*a* to a unit 22*d*. In other words, in the case where a variable $s_t(x1,x2)$ is supplied, the action value function $Q(s_t,a_t)$ can be represented by four outputs of the action value function $Q(s_t,a_t=a_{1 \text{ to } 4})$. There are four possible actions $a_1$ to $a_4$. An action 1 to an action 4 are linked to action value functions $Q(s_t,a_1)$ to $Q(s_t,a_4)$, respectively. The agent selects an action value function Qmax that has the maximum value from the action value functions $Q(s_t,a_1)$ to $Q(s_t,a_4)$, and executes an action that is linked to the action value function Qmax.

In general, in learning of reinforcement learning, the weight coefficient of a neural network is updated such that the error E between output data and teacher data becomes small. Update of the weight coefficient is repeated until the error E between the output data and the teacher data becomes a certain value. In Q learning, which is a kind of reinforcement learning, the purpose of the learning is to search for the optimal action value function $Q(s_t,a_t)$; however, the optimal action value function $Q(s_t,a_t)$ is not found during the learning. Thus, an action value function $Q(s_{t+1}, a_{t+1})$ at the next time t+1 is estimated, and $r_{t+1}+\max Q(s_{t+1}, a_{t+1})$ is used as the teacher data. The learning of the neural network is performed by using the teacher data for calculation of the error E and a loss function.

Figure 9:
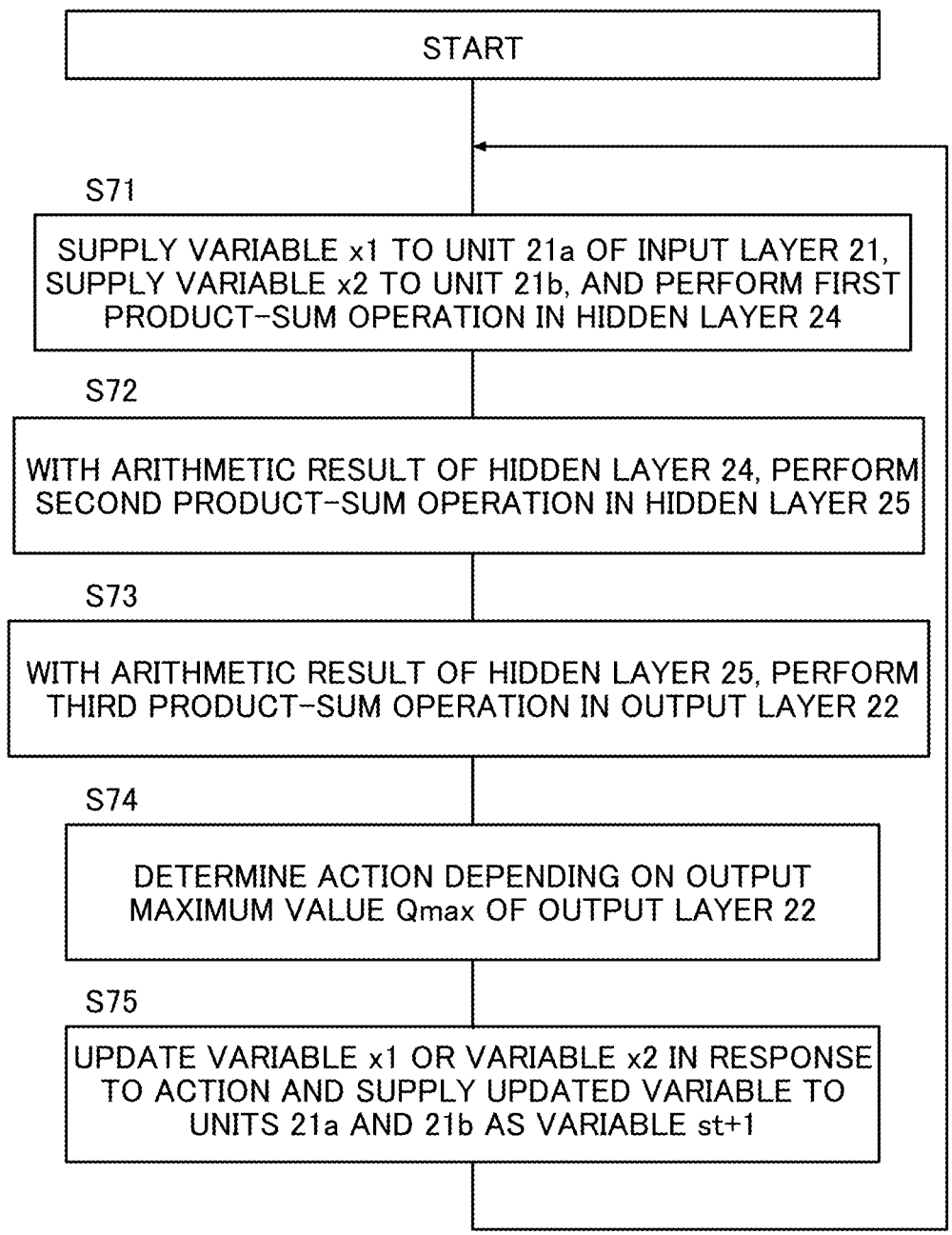
FIG. 9 is a flow chart showing a neural network.

FIG. 9 is a flow chart showing the neural network 15.

In Step S71, a variable x1 is supplied to the unit 21*a* of the input layer 21, a variable x2 is supplied to a unit 21*b* of the input layer 21, and fully connected first product-sum operation is performed in the hidden layer 24. Note that normalization may be performed as appropriate on the variable x1 and the variable x2. The normalization can increase learning speed.

In Step S72, fully connected second product-sum operation is performed in the hidden layer 25 by using an arithmetic result of the hidden layer 24.

In Step S73, third product-sum operation is performed in the output layer 22 by using an arithmetic result of the hidden layer 25.

In Step S74, the action value function Qmax that has the maximum value is selected from the action value functions $Q(s_t,a_1)$ to $Q(s_t,a_4)$ that are outputs of the output layer 22, and an action that is linked to the action value function Qmax is determined.

In Step S75, the variable x1 and the variable x2 are updated by the action, and the variable $s_{t+1}$ is supplied to the unit 21*a* and the unit 21*b*.

Figure 10:
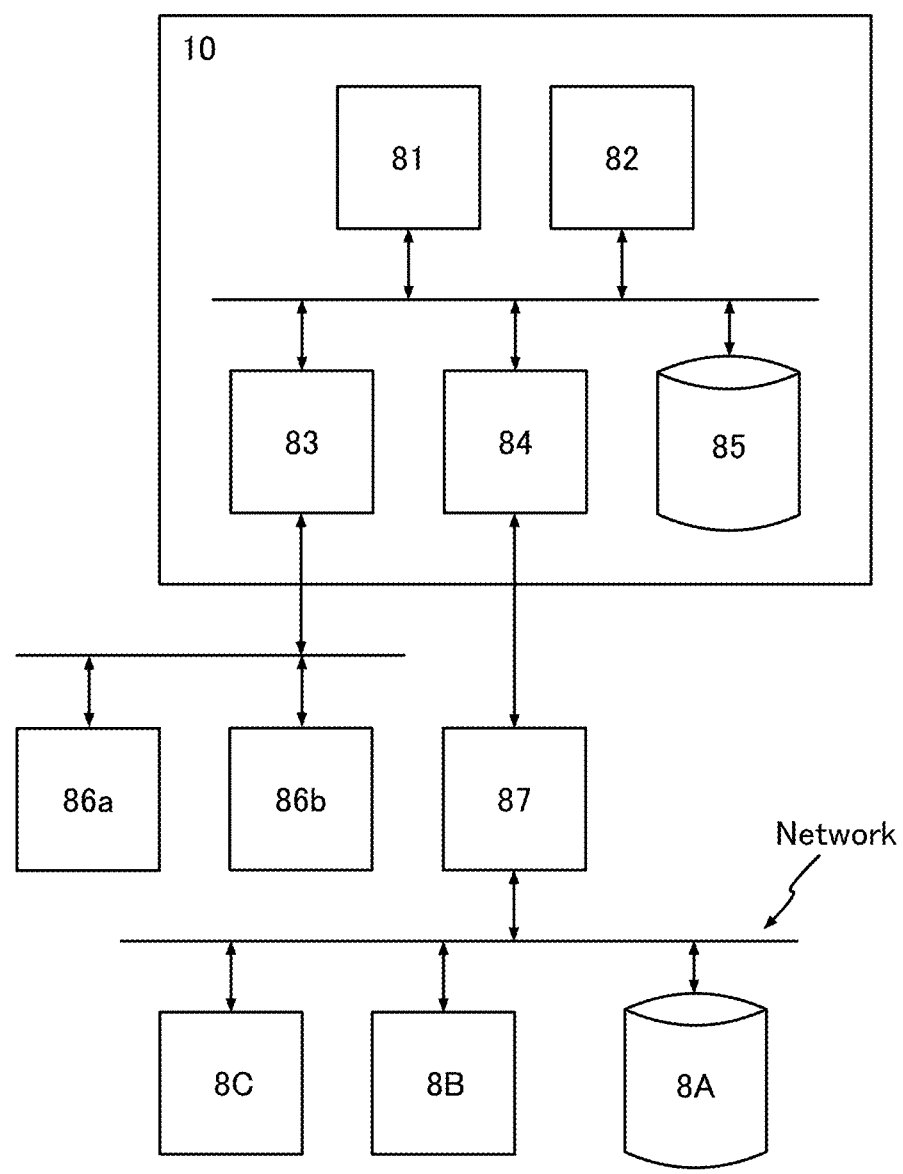
FIG. 10 is a block diagram illustrating a parameter search device with a parameter search method.

FIG. 10 is a block diagram illustrating the parameter search device 10 with a parameter search method.

The parameter search device 10 includes an arithmetic portion 81, a memory 82, an input/output interface 83, a communication device 84, and a storage 85. In other words, the parameter search method using the parameter search device 10 is provided by a program including the parameter extraction portion 11, the circuit simulator 12, the classification model 13, the control portion 14, and the neural network 15. Note that the program is stored in the storage 85 or the memory 82, and parameter search is performed using the arithmetic portion 81.

A display device 86*a*, a keyboard 86*b*, and the like are electrically connected to the input/output interface 83. Note that although not illustrated in FIG. 10, a mouse or the like may be connected.

The communication device 84 is electrically connected to another network (Network) through a network interface 87. Note that the network interface 87 includes wired or wireless communication. A database 8A, a remote computer 8B, and a remote computer 8C, and the like are electrically connected to the network. Note that the database 8A, the remote computer 8B, and the remote computer 8C that are electrically connected through the network may be placed in different buildings, different regions, or different countries.

Note that in parameter search by the parameter search device 10, a computer where the control portion 14 operates may be different from a computer (including a server computer) where the parameter extraction portion 11, the circuit simulator 12, or the classification model 13 operates.

As described above, one embodiment of the present invention can provide a parameter search method of a computerized netlist by utilizing a computer. With the computerized netlist, a model parameter suitable for the required characteristics of the netlist can be searched using a computer resource.

Alternatively, in one embodiment of the present invention, model parameters can be extracted from a semiconductor element data set, a group of model parameters can be learned by a classification model, and the model parameters can be classified by the classification model. In a parameter classification method, with the use of the model parameters classified by the classification model, a model parameter suitable for the required characteristics of the netlist can be searched efficiently.

Alternatively, in one embodiment of the present invention, when new model parameters are supplied to the classification model, it is possible to show the probability of fitness of each of the model parameters for required characteristics that can be classified by the classification model. Thus, an appropriate model parameter can be selected. It is possible to provide a parameter selection method in which a model parameter suitable for the required characteristics of a target netlist can be selected easily.

One embodiment of the present invention can provide a parameter search system in which search is performed using reinforcement learning so that a variable of a netlist supplied to a circuit simulator is the best candidate satisfying the required characteristics of the netlist.

As described above, as the parameter search system, a parameter search system in which the best candidate satisfying the required characteristics of the netlist is searched through a combination of a parameter learning method in which a classification model learns a model parameter, a parameter selection method for selecting an appropriate model parameter, and reinforcement learning can be provided.

The structure and method described in one embodiment of the present invention can be used in an appropriate combination with the structure and method described in the example.

[Example]

In this example, parameter search was performed by a parameter search method according to one embodiment of the present invention. Details of the parameter search method will be described below using FIG. 11 to FIG. 14. Note that Silvaco's Utmost IV™ was used as the parameter extraction portion 11. As the circuit simulation 12, ngspice, which is an open source, or Silvaco's SmartSpice™ was used. To simplify the description, the inverter circuit illustrated in FIG. 7A is used as a target netlist. Note that in this example, the description is made on the assumption that 20 model parameters are extracted using the classification model 13 and Utmost IV.

FIG. 11 is an example of a program code of the netlist in which the inverter circuit is written. Note that in FIG. 11, in order to describe the program code, the line number of a program is added at the beginning of the line.

FIG. 11 shows the netlist of the inverter circuit used in this example.

In a first line, a model parameter variable for parameter search was defined. Note that items to be set by the user are underlined for differentiation. In this example, parameter search is performed such that transistor channel width W1 is the best candidate. In this example, a variable param_w1 was used such that the channel width W1 was able to be changed during learning.

In a second line, a variable param_fname was used such that a file in which a model parameter is written was able to be selected. Note that the variable param_fname will be described in detail in FIG. 12.

In a third line or a fourth line, a power supply voltage or a signal supplied to the inverter circuit is set.

In a fifth line or a sixth line, a semiconductor element used for the inverter circuit and connection information are set.

In a seventh line or an eighth line, a model of the semiconductor element used in the fifth line or the sixth line is set. In this example, the semiconductor element is a transistor. An n-channel transistor or a p-channel transistor is set as the transistor.

In a ninth line or a tenth line, analysis conditions for required characteristics of the inverter circuit are set.

In the ninth line, an average value (required characteristics iavg) of a current flowing through a power source is set as a search target using transient analysis.

In the tenth line, signal delay time (required characteristics tpd) is set as a search target using transient analysis.

Note that a definition file of model parameters used in this example is described. As an example, a definition file level3-sample-01.lib is described. Note that the model parameters used in this example were set in a level3 format. Note that transistor model parameters have a plurality of different settings such as levels 1 to 3. The user preferably uses transistor models with required levels. In this example, general model parameters for an n-channel transistor and a p-channel transistor were set. In addition, in this example, the definition file includes at least a threshold voltage VTO. Note that in this example, the threshold voltage VTO is treated as a model parameter variable.

FIG. 12 shows a user settings file used in this example.

In a first line, the use of the circuit simulator ngspice is declared. Note that the circuit simulator SmartSpice™ may be used.

In a second line, a reference of the netlist that is described in FIG. 11 and is used in the circuit simulator ngspice is set.

In a third line, a destination to which the second output result of the circuit simulator ngspice is output is set.

In a fourth line, the upper limit and the lower limit of an actionable range supplied to the circuit simulator ngspice are supplied. In this example, a channel width lower limit of 1 μm and a channel width upper limit of 20 μm are set.

In a fifth line, a file (for example, level3-sample-01.lib) in which model parameters to be supplied to the circuit simulator ngspice are written is set. In this example, parameter search is performed using model parameters in which the threshold voltages VTO under 20 different conditions are written.

In a sixth line or a seventh line, a convergence condition for the second output result that is output from the circuit simulator ngspice is set.

In the sixth line, a target value of a convergence condition for the average value (the required characteristics iavg) of a current flowing through the power source is set using transient analysis.

In the seventh line, a target value of a convergence condition for the signal delay time (the required characteristics tpd) is set using transient analysis.

Figure 13A:
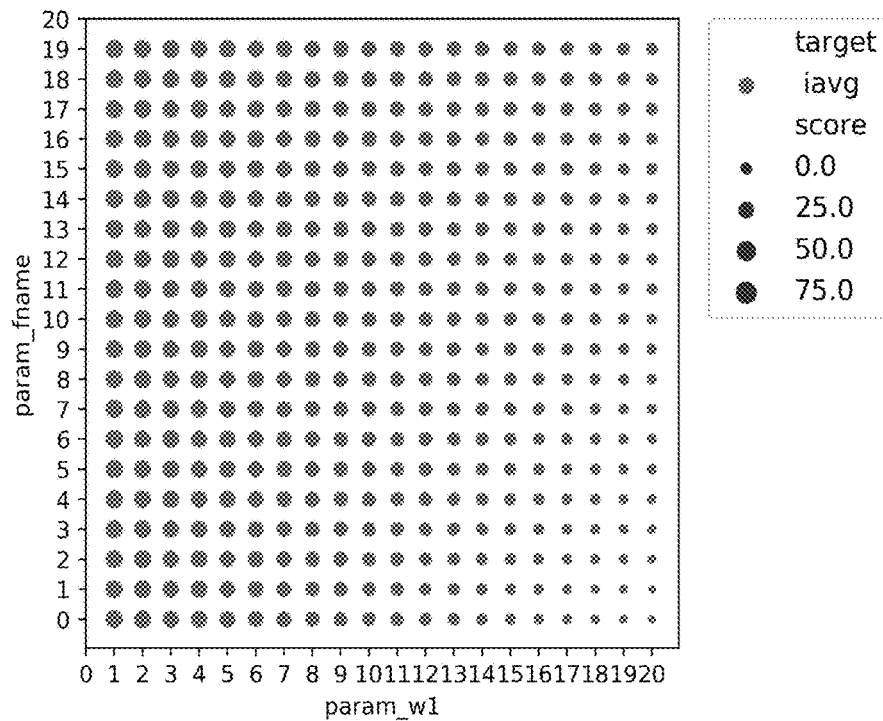
FIG. 13A and FIG. 13B are diagrams each showing a model parameter search result.
Figure 13B:
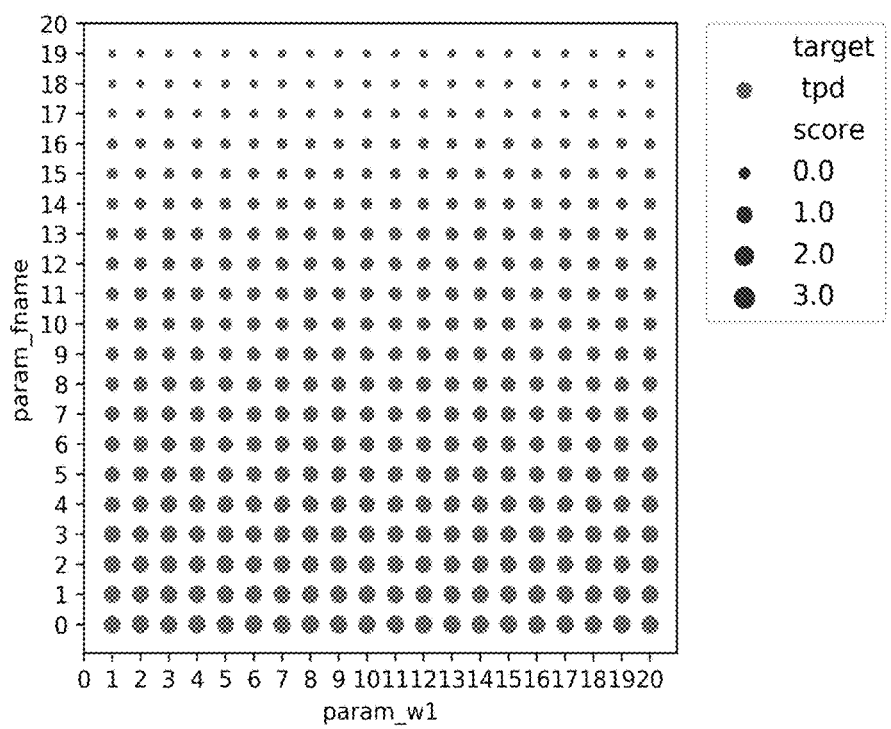

FIG. 13A and FIG. 13B show search results of model parameters for the required characteristics of the netlist by the parameter search method according to this example. A horizontal axis shows that the channel width W1 is 1 μm when param_w1 is 1 and the channel width W1 is 20 μm when param_w1 is 20. A vertical axis shows that the threshold voltage VTO is 0.00 V when the variable param_f-name is 0 and the threshold voltage VTO is 0.95 V when the variable param_fname is 19. In circuit simulation using each parameter, output was performed such that as the model parameters became closer to the respective required characteristics, plots became larger. Note that a plot in a portion of a parameter that is closest to the target value was the largest.

FIG. 13A shows search results of parameters for the required characteristics iavg. Note that it was confirmed that as the channel width W1 became smaller, the required characteristics iavg became smaller and the parameter was suitable for low power consumption.

FIG. 13B shows search results of parameters for required characteristics tad. Note that it was confirmed that as the threshold voltage VTO became lower or the required characteristics tad became smaller, the delay time became shorter. In other words, a model parameter suitable for the shorter delay time was able to be searched.

Figure 14A:
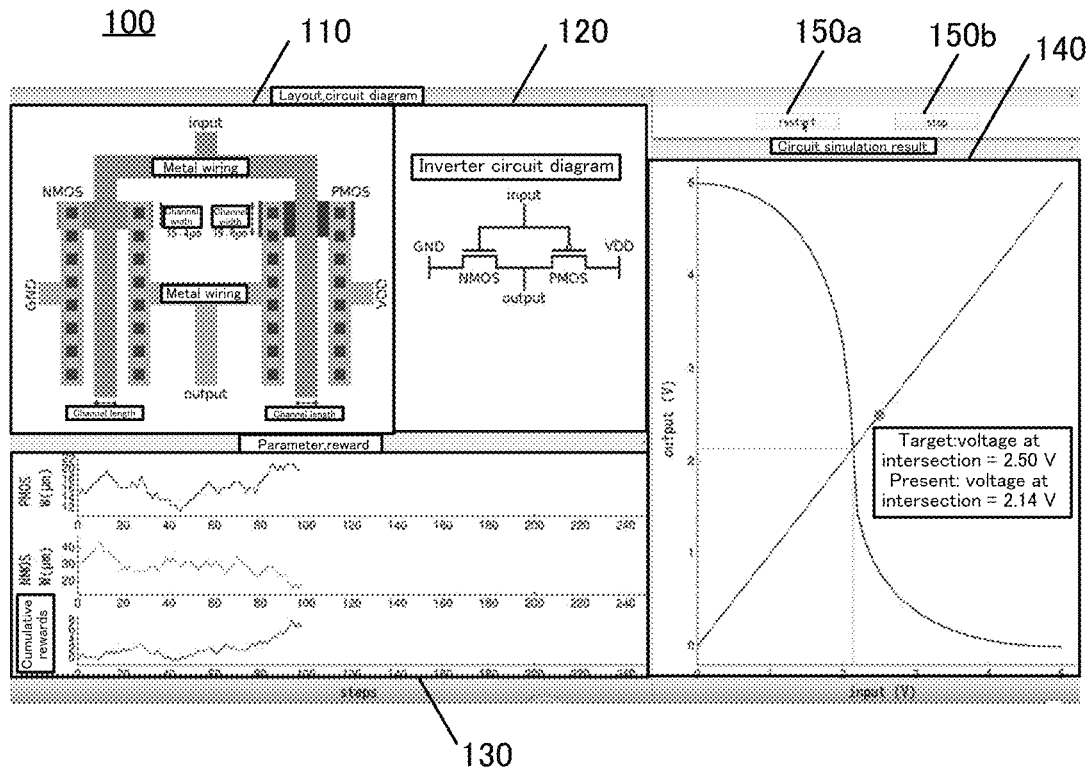
FIG. 14A and FIG. 14B are diagrams each showing a Graphical User Interface (GUI).
Figure 14B:
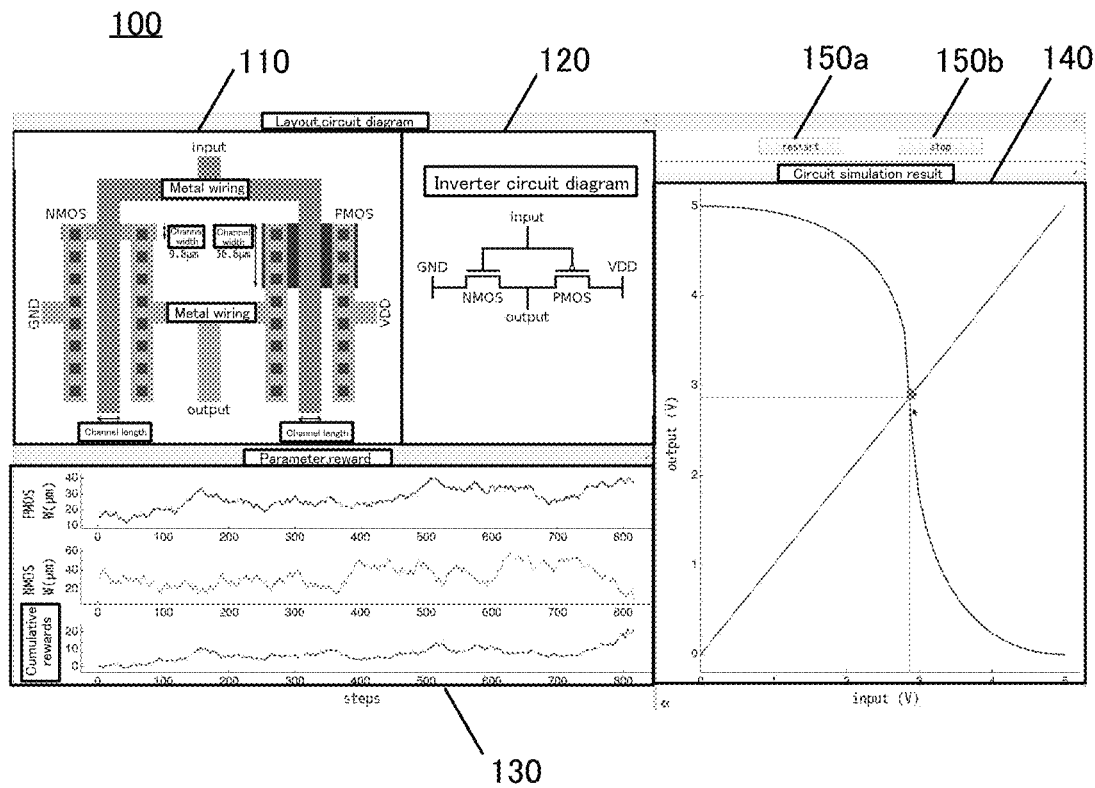

FIG. 14A and FIG. 14B each show an example of a GUI into which this example is incorporated. A GUI 100 can display a layout display region 110, a circuit configuration 120 generated from the netlist, parameter search results 130 displayed in real time, and a circuit simulator simulation result 140. In addition, the GUI 100 includes a start button or a restart button (hereinafter, a start button 150a) or a stop button 150b. Note that it is preferable that items to be displayed can be selected by the user.

In FIG. 14A, parameter search was started after a netlist or a user settings file was provided to the GUI by the user and the start button 150a was pressed. In this example, the netlist provided to the GUI was an inverter circuit. The maximum amplitude of an input signal supplied to the inverter circuit was set to 5 V. Thus, the maximum amplitude of an output signal output from the inverter circuit was set to 5 V.

For the parameter search results 130 displayed in real time, display is updated every time parameter search is executed. In this example, as the parameter search results 130 displayed in real time, PMOS channel width and NMOS channel width that are searched by the parameter search method, and the size of a cumulative reward given to search results are displayed.

As the circuit simulator simulation result 140, a result of circuit simulation performed using the parameter search results is displayed. Note that in this example, DC analysis is performed using the circuit simulator. The convergence condition was set to 2.5 V at which the voltage of the output signal becomes equal to the voltage of the input signal. Note that as the simulation result 140, the convergence condition and the simulation result are displayed. The reward is determined in accordance with a difference between the convergence condition and the simulation result. A weight coefficient of the neural network is updated depending on the reward.

FIG. 14B illustrates an example in which the simulation result of the circuit simulator achieves the convergence condition set by the user.

The structure described in this example can be used in an appropriate combination with the structure described in the embodiment.

REFERENCE NUMERALS

DS1: measurement data, DS2: measurement data, DS3: process parameter, F1: setup file, F2: output data, S30: step, S31: step, S32: step, S33: step, S34: step, S35: step, S41: step, S42: step, S43: step, S44: step, S45: step, S46: step, S47: step, S48: step, S51: step, S52: step, S53: step, S54: step, S55: step, S56: step, S57: step, S58: step, S59: step, S5A: step, S5B: step, SD1: wiring, SD2: wiring, 8A: database, 8B: remote computer, 8C: remote computer, 10: parameter search device, 11: parameter extraction portion, 12: circuit simulator, 13: classification model, 14: control portion, 15: neural network, 21: input layer, 21a: unit, 21b: unit, 22: output layer, 22a: unit, 22b: unit, 22c: unit, 22d: unit, 23: intermediate layer, 24: hidden layer, 24a: hidden layer, 24m: hidden layer, 25: hidden layer, 25a: hidden layer, 25m: hidden layer, 61: transistor, 61A: transistor, 62: transistor, 63: resistor, 64: capacitor, 65: wiring, 66: wiring, 81: arithmetic portion, 82: memory, 83: input/output interface, 84: communication device, 85: storage, 86a: display device, 86b: keyboard, 87: network interface, 100: GUI, 110: layout display region, 120: circuit configuration generated from netlist, 130: parameter search result displayed in real time, 140: simulation result, 150a: start button, and 150b: stop button.

What is claimed is:

1. A parameter search method executed using a classification model, a neural network, a circuit simulator, and a control portion, the parameter search method comprising:
   selecting a model parameter for a required characteristics of a netlist by the control portion using the classification model,
   supplying first model parameter variables included in the model parameter from the control portion to the neural network,
   calculating a first action value function Q from the first model parameter variables by the neural network,
   updating the first model parameter variables to second model parameter variables by the control portion using the first action value function Q and outputting a second model parameter,
   performing simulation by the circuit simulator using the netlist and the second model parameter and outputting an output result,
   judging the output result by the control portion using a convergence condition given to the netlist, and
   setting a reward by the control portion when the output result is judged not to satisfy required characteristics of the netlist and updating a weight coefficient of the neural network using the reward,
   wherein when the output result is judged to satisfy the required characteristics of the netlist, the first model parameter variables is judged to be the best candidate for the netlist.

2. The parameter search method according to claim 1, wherein the number of units of output layers of the neural network is twice or more as large as the number of the first model parameter variables.

3. The parameter search method according to claim 1, wherein the required characteristics of the netlist comprises at least one of a low power consumption, an operating frequency, and a stability in a frequency band.

4. The parameter search method according to claim 1, wherein the classification model is configured to show a probability of fitness of the model parameter for any required characteristics.

5. A parameter search method executed using a classification model, a neural network, a circuit simulator, and a control portion, the parameter search method comprising:

selecting a model parameter for a required characteristics of a netlist by the control portion using the classification model, supplying first model parameter variables included in the model parameter from the control portion to the neural network, calculating a first action value function Q from the first model parameter variables by the neural network, updating the first model parameter variables to a second model parameter variable by the control portion using the first action value function Q and outputting a third model parameter, performing simulation by the circuit simulator using the netlist and the third model parameter and outputting an output result, judging the output result by the control portion using a convergence condition given to the netlist, setting a high reward by the control portion in the case where the output result is close to the convergence condition and setting a low reward by the control portion in the case where the output result is far from the convergence condition when the output result is judged not to satisfy required characteristics of the netlist, calculating a second action value function Q from the second model parameter variable by the neural network, and updating a weight coefficient of the neural network by the neural network using an error calculated using the reward, the first action value function Q, and the second action value function Q, wherein when the output result is judged to satisfy the required characteristics of the netlist, the first model parameter variables is judged to be the best candidate for the netlist.

6. The parameter search method according to claim 5, wherein the number of units of output layers of the neural network is twice or more as large as the number of the first model parameter variables.

7. The parameter search method according to claim 5, wherein the required characteristics of the netlist comprises at least one of a low power consumption, an operating frequency, and a stability in a frequency band.

8. The parameter search method according to claim 5, wherein the classification model is configured to show a probability of fitness of the model parameter for any required characteristics.

\* \* \* \* \*